United States Patent
Jain et al.

(10) Patent No.: US 11,809,327 B2
(45) Date of Patent: Nov. 7, 2023

(54) DATA AUTO-RELOCATION IN AN INTEGRATED MEMORY ASSEMBLY

(71) Applicant: Western Digital Technologies, Inc., San Jose, CA (US)

(72) Inventors: Vimal Kumar Jain, Bangalore (IN); Bala Siva Kumar Narala, Kakinada (IN)

(73) Assignee: Western Digital Technologies, Inc., San Jose, CA (US)

( * ) Notice: Subject to any disclaimer, the term of this patent is extended or adjusted under 35 U.S.C. 154(b) by 71 days.

(21) Appl. No.: 17/527,792

(22) Filed: Nov. 16, 2021

(65) Prior Publication Data

US 2023/0153248 A1 May 18, 2023

(51) Int. Cl.
| | | |
|---|---|---|
| *G06F 12/10* | (2016.01) | |
| *G06F 12/1009* | (2016.01) | |
| *G11C 16/26* | (2006.01) | |
| *G11C 16/04* | (2006.01) | |
| *H01L 25/065* | (2023.01) | |

(52) U.S. Cl.
CPC .......... *G06F 12/1009* (2013.01); *G11C 16/26* (2013.01); *G06F 2212/2022* (2013.01); *G11C 16/0483* (2013.01); *H01L 25/0657* (2013.01); *H01L 2225/06562* (2013.01)

(58) Field of Classification Search
CPC ......... G06F 12/1009; G06F 2212/2022; G11C 16/26; G11C 16/0483; H01L 25/0657; H01L 2225/06562
USPC ........................................................ 711/206
See application file for complete search history.

(56) References Cited

U.S. PATENT DOCUMENTS

| | | |
|---|---|---|
| 7,409,473 B2 | 8/2008 | Conley et al. |
| 7,849,381 B2 | 12/2010 | Tomlin |
| 8,543,742 B2 | 9/2013 | Yu et al. |
| 8,626,987 B2 | 1/2014 | Jung et al. |
| 9,021,187 B2 | 4/2015 | Sela et al. |
| 9,652,382 B1 | 5/2017 | Subramanian et al. |
| 10,162,748 B2 | 12/2018 | Kotte et al. |
| 10,387,303 B2 | 8/2019 | Mehra et al. |

(Continued)

OTHER PUBLICATIONS

U.S. Appl. No. 17/494,129, filed Oct. 5, 2021.
U.S. Appl. No. 16/870,930, filed May 9, 2020.
U.S. Appl. No. 17/177,310, filed Feb. 17, 2021.

*Primary Examiner* — Hua J Song
(74) *Attorney, Agent, or Firm* — Vierra Magen Marcus LLP

(57) ABSTRACT

Technology is disclosed for relocating data in a non-volatile storage system. An integrated memory assembly has a control die and a memory die that contains the memory cells. The control die contains control circuitry that relocates data from one set of physical addresses on the memory die to another set of physical addresses on the memory die. This relocation results in a change of a mapping between logical addresses for the data and the physical addresses for the data. The control circuitry may update an L2P table on the memory die after the relocation to map the logical addresses of the data to the second set of physical addresses. The control die may construct a validity bitmap, which specifies whether data at a physical address is valid or invalid. The foregoing reduces data transfer between the integrated memory assembly and a memory controller, which saves time and power.

17 Claims, 16 Drawing Sheets

(56) References Cited

U.S. PATENT DOCUMENTS

| | | |
|---|---|---|
| 10,459,644 B2 | 10/2019 | Mehra et al. |
| 2014/0136761 A1 | 5/2014 | Li et al. |
| 2016/0062666 A1* | 3/2016 | Samuels ............... G06F 3/0616 |
| | | 711/103 |
| 2016/0232088 A1 | 8/2016 | Mohan et al. |
| 2017/0083438 A1* | 3/2017 | Han ..................... G06F 3/0676 |
| 2018/0260317 A1 | 9/2018 | Chu |
| 2019/0272229 A1 | 9/2019 | Halumi et al. |
| 2019/0341375 A1 | 11/2019 | Hirano et al. |
| 2020/0319815 A1* | 10/2020 | Dutta ................. G06F 12/0246 |

\* cited by examiner

DATA AUTO-RELOCATION IN AN INTEGRATED MEMORY ASSEMBLY

BACKGROUND

The strong growth in demand for portable consumer electronic devices is driving the need for high-capacity storage systems. Non-volatile semiconductor storage systems, such as flash memory, are widely used to meet the ever-growing demands on digital information storage and exchange. Their portability, versatility and rugged design, along with their high reliability and large capacity, have made such storage devices ideal for use in a wide variety of electronic devices, including for example, digital cameras, digital music players, video game consoles, PDAs, cellular telephones, personal computers and servers.

Non-volatile semiconductor storage systems typically include one or more memory die. Each memory die includes a memory array that stores data. In some examples of flash memory, the memory array is divided into blocks of memory cells and the data stored in the memory can only be erased at the block level (e.g., an entire block at a time). As data is overwritten or deleted, the memory system may mark that overwritten or deleted data as invalid or stale. Over time, data stored in a block of memory cells may become fragmented such that groups of valid data may be separated by invalid data (e.g., data that was rewritten somewhere else, deleted, etc.). This results in inefficient use of space in the memory array. As the amount of data stored in the memory approaches the capacity of the memory, the space wasted for the invalid data between fragments of valid data needs to be reclaimed.

In many storage systems, the non-volatile memory is addressed internally to the storage system using physical addresses. However, a host system will use logical addresses. The storage system is free to store the data at a chosen physical address and move the data to a different physical address. The storage system performs address translation between the logical addresses used by the host and the physical addresses used within the storage system. One example implementation is to maintain tables that identify the current translation between logical addresses and physical addresses. Herein, such translation tables may be referred to as L2P (logical address to physical address) tables. An entry in an L2P table may include an identification of a logical address and corresponding physical address. The storage system will update the L2P table if it moves data from one physical address to another physical address.

DETAILED DESCRIPTION

Technology is disclosed herein for relocating data in a non-volatile storage system. One embodiment includes an integrated memory assembly that has a control die and a memory die. The memory die contains the memory cells. The control die contains control circuitry that controls memory operations on the memory die. In an embodiment, the control circuitry on the control die relocates data from one set of physical addresses on the memory die to another set of physical addresses on the memory die. This relocation results in a change of a mapping between logical addresses for the data and the physical addresses for the data. In an embodiment, the control circuitry on the control die updates an L2P table on the memory die after the relocation to map the logical addresses of the data to the second set of physical addresses. The foregoing reduces data transfer between the integrated memory assembly and a memory controller, which saves time and power.

In one embodiment, the control die compacts the data that is relocated. Compacting the data removes one or more gaps in the data at the first set of physical addresses. However, prior to compacting the data, the control circuit on the control die may construct a validity bitmap, which specifies whether data at a physical address is valid or invalid. In an embodiment, the validity bitmap is constructed based on logical address to physical address mappings in the L2P table. Constructing the validity bitmap on the control die reduces data transfer from the control die to the memory controller. Therefore, time and power are saved by a reduction in data transfer from the control die to the memory controller.

In an embodiment, the memory controller sends the control die a pointer to an L2P table that is stored in memory cells on the memory die. The control die uses the L2P table to determine whether the data at respective physical addresses is valid or invalid. After the control die compacts the data, the control die updates the L2P table and stores the update in the memory cells on the memory die. Therefore, the L2P table is updated on the memory die without sending data from the integrated memory assembly to the memory controller, which saves time and power.

Figure 1:
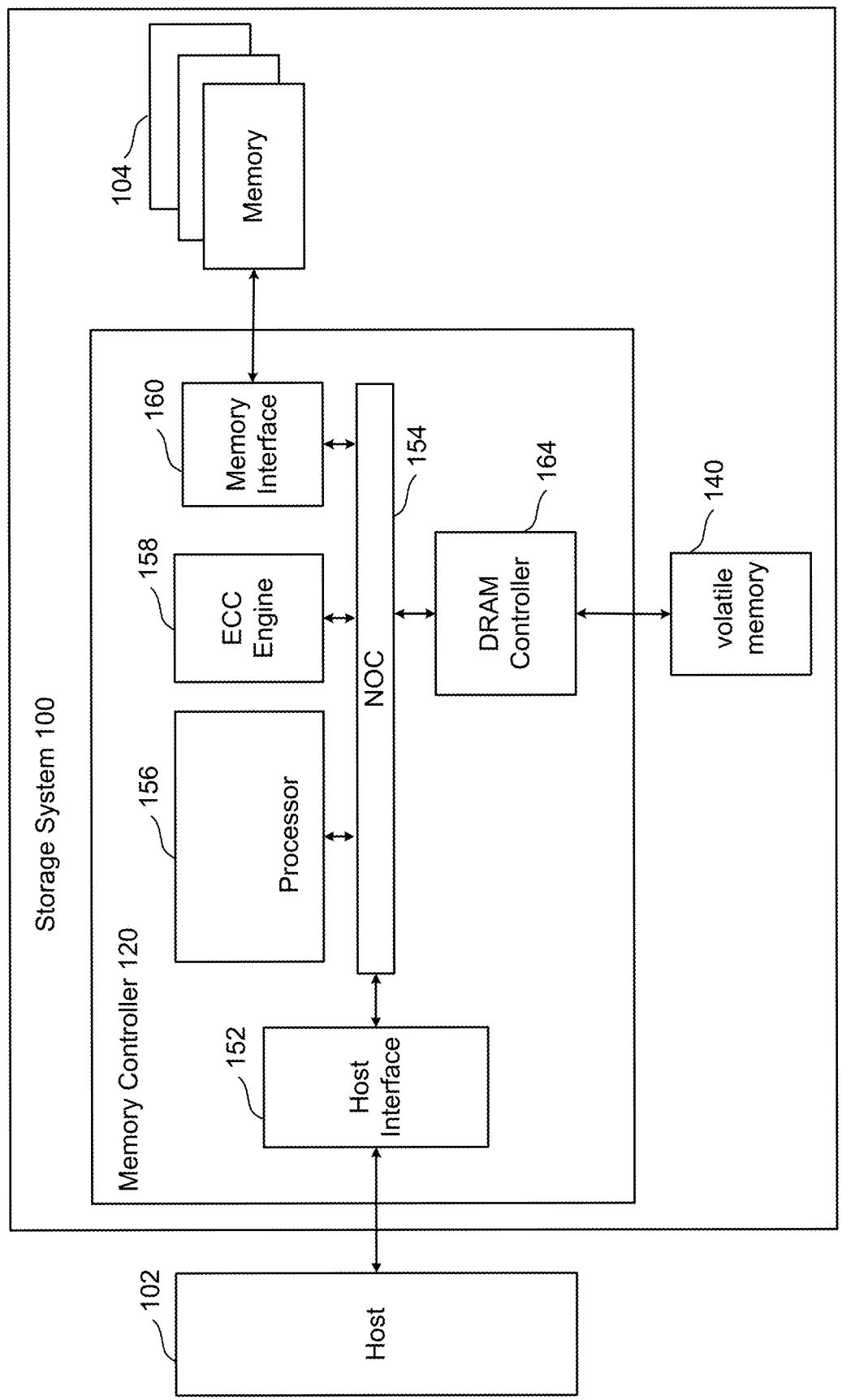
FIG. 1 is a block diagram of one embodiment of a storage system connected to a host.

FIGS. 1-4A describe one example of a storage system that can be used to implement the technology disclosed herein for relocating data. FIG. 1 is a block diagram of one embodiment of a storage system 100 connected to a host 102. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 104 and local high speed volatile memory 140 (e.g., DRAM, SRAM). In one embodiment, non-volatile memory 104 includes an integrated memory assembly 104. In one embodiment, there are a plurality of integrated memory assemblies 104. In an embodiment, each integrated memory assembly 104 includes one or more memory die and one or more control die. Each memory die may include one or more memory structures. A control die may control operations on a memory die. For example, a control die may control and perform read, write, and erase operations on a memory die. In one embodiment, memory controller 120 communicates with a control die in order to instruct the control die to perform read, write, or erase operations on one or more non-volatile memory die or one or more memory structures. In one embodiment, each memory die in the integrated memory assembly 104 utilizes NAND flash memory (including two dimensional NAND flash memory and/or three dimensional NAND flash memory). In other embodiments, the integrated memory assembly 104 can include other types of memory; for example, PCM memory and MRAM.

Local high speed volatile memory 140 is used by memory controller 120 to perform certain operations. For example, local high speed volatile memory 140 may cache logical to physical address translation tables ("L2P tables"). A permanent copy of the L2P tables may be stored in the memory 104. Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory 104 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
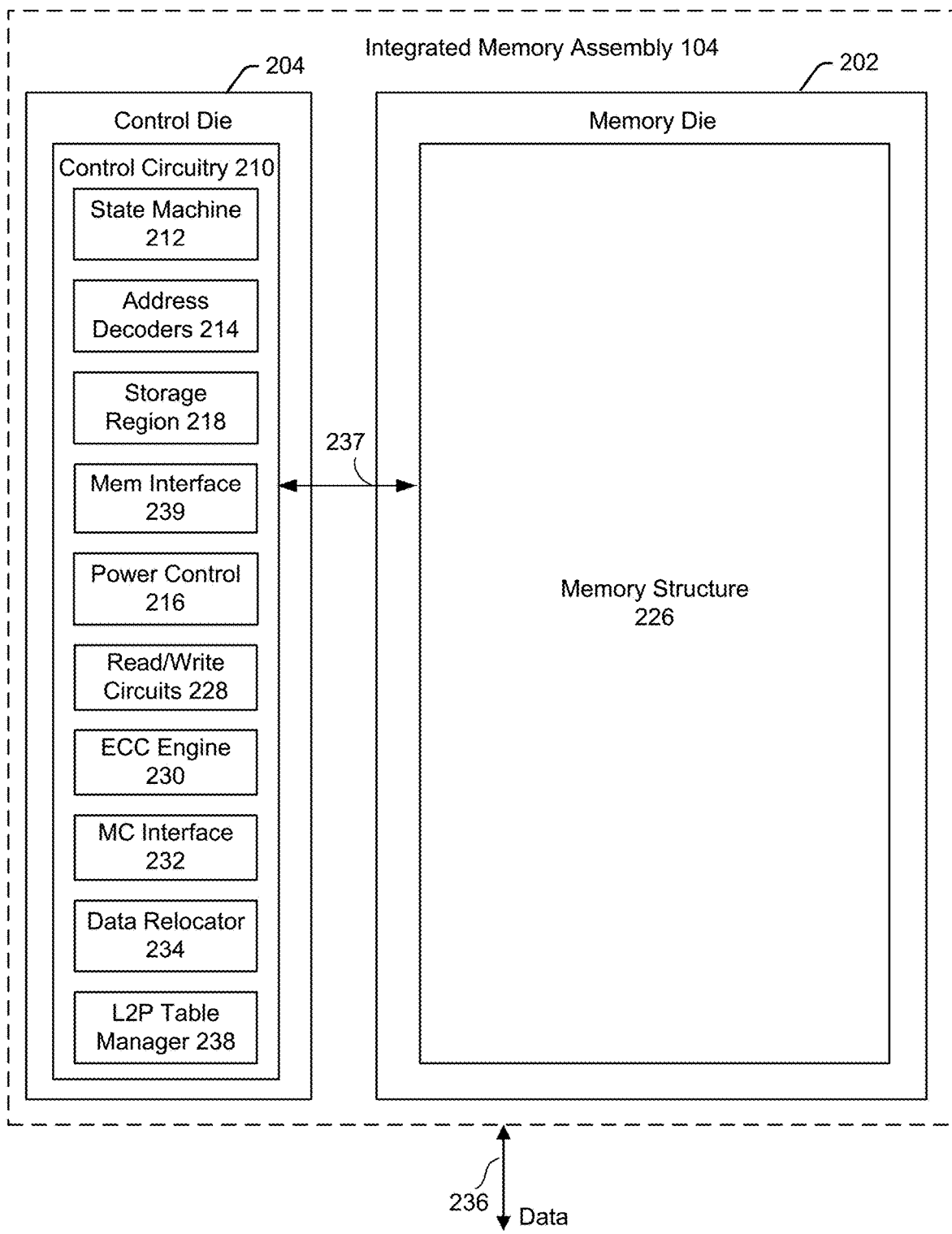
FIG. 2A is a functional block diagram of an integrated memory assembly.

FIG. 2A is a functional block diagram of one embodiment of an integrated memory assembly 104. In one embodiment, the integrated memory assembly 104 includes two semiconductor die (or more succinctly, "die"): memory die 202 and control die 204. Memory die 202 includes include memory structure 226. Memory structure 226 includes non-volatile memory cells. Control die 204 includes control circuitry 210. In some embodiments, the memory die 202 and the control die 204 are directly bonded together, as will be described in more detail below. For purposes of this document, the phrase directly bonded refers to the memory die being bonded to the control die with no other die between the memory die and the control die.

Control circuitry 210 comprises a set of electrical circuits that perform memory operations (e.g., write, read, erase and others) on memory structure 226. Control circuitry 210 includes state machine 212, an on-chip address decoder 214, a power control circuit 216, storage region 218, read/write circuits 228, ECC engine 230, memory controller interface 232, memory die interface 239, data relocator 234, and L2P manager 238. In another embodiment, a portion of the read/write circuits 228 are located on control die 204 and a portion of the read/write circuits 228 are located on memory die 202. For example, the read/write circuits 228 may contain sense amplifiers. In one embodiment, the sense amplifiers (for reading data from the memory die) are located on the control die 204. In one embodiment, the sense amplifiers are located on the memory die 202.

Herein, the term, "memory die," "memory semiconductor die," or the like, means a semiconductor die that contains non-volatile memory cells for storage of data. Herein, the term, "control die," "control semiconductor die," or the like, means a semiconductor die that contains control circuitry for performing memory operations on non-volatile memory cells on a memory die at a die level. Performing memory operations at the die level means that the control die will control the magnitude and timing of voltages applied to the memory structure 226 during the memory operations. Typically, numerous semiconductor die are formed from a single semiconductor (e.g., silicon) wafer.

State machine 212 is an electrical circuit that controls the operations performed by control die 204. In some embodiments, state machine 212 is implemented by or replaced by a microprocessor, microcontroller and/or RISC processor.

Storage region 218 can be volatile memory used to store software for programming a processor (e.g., the RISC processor used to implement or replace state machine 212) and for storing data. For example, storage region 218 may be used for temporary storage of data fragments during data compaction. Storage region 218 may also be used for temporary storage of an L2P table. In one embodiment, storage region 218 is implemented with SRAM or DRAM.

The on-chip address decoder 214 provides an address interface between addresses used by host 102 or memory controller 120 to the hardware address used by row decoders and column decoders (not expressly depicted in FIG. 2A). Power control circuit 216 controls the power and voltages supplied to the word lines, bit lines, and select lines during memory operations. The power control circuit 216 includes voltage circuitry, in one embodiment. Power control circuit 216 may include charge pumps or other voltage sources for creating voltages. The power control circuit 216 executes under control of the state machine 212.

The read/write circuits 228 includes sense blocks (which may contain sense amplifies (SA), in some embodiments. The sense amplifies include bit line drivers, in some embodiments. The read/write circuits 228 executes under control of the state machine 212, in one embodiment. Each memory structure 226 is addressable by word lines by way of a row decoder (not depicted in FIG. 2A) and by bit lines by way of a column decoder (not depicted in FIG. 2A), in some embodiments.

The error correction code (ECC) engine 230 is a circuit configured to decode and error correct codewords. Herein, ECC engine 230 may be referred to as an on-die ECC engine. In one embodiment, the on-die ECC engine 230 is configured to encode data bits from memory controller 120 into codewords that contain the data bits and parity bits. The control circuitry stores the codewords in the memory structure 226. In one embodiment, the on-die ECC engine 230 is also configured to decode the codewords which are read from the memory structure 226.

The data relocator 234 is able to relocate data from a first set of physical addresses in the memory structure 226 to a second set of physical addresses in the memory structure 226. In some embodiments, the data relocator 234 compacts fragmented data on memory die 202. For example, the data relocator 234 removes one or more gaps in the data stored at the first set of physical addresses such that there are no gaps between the data when stored at the second set of physical addresses. In one embodiment, the data relocator 234 builds a data validity map (which may also be referred to as a validity bitmap), which indicates whether a unit of data at a specific physical address is valid or invalid. In one embodiment, the unit of data is 4 KB, but the unit of data could be larger or smaller than 4 KB. In some embodiments, the data relocation function (e.g., data compaction) can be implemented using software running on the state machine 212 or other processor. Data relocator 234 can be hardware, software, or a combination of hardware and software.

In one embodiment, the memory controller 120 sends the control circuitry 210 a pointer to an L2P table that is stored in the memory structure 226. The control circuitry 210 accesses the L2P table from the memory structure 226. The L2P table may temporarily be stored in storage region 218. The data relocator 234 may use a mapping between logical addresses (in a host address space) and physical addresses (in the memory structure 226) to help relocate the data. In an embodiment, the data relocator 234 uses the L2P table, along with headers of data in the memory structure 226, to build the data validity map. The header of a unit of data indicates the logical address of that unit of data.

The L2P manager 238 manages an L2P table. In an embodiment, the L2P manager 238 updates the L2P table after the data is moved from the first set of physical addresses to the second set of physical addresses. For example, the L2P table is updated to change the association of the logical addresses of the data from the first set of physical addresses to the second set of physical addresses. The control circuitry 210 writes the updated L2P table to the memory structure 226 and notifies the memory controller 120 of the update. In some embodiments, the L2P manager 238 can be implemented using software running on the state machine 212 or other processor. The L2P manager 238 can be hardware, software, or a combination of hardware and software.

In one embodiment, all or a subset of the circuits of control circuitry 210 can be considered one or more control circuits. The one or more control circuits can include hardware only (e.g., electrical circuits) or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), microcontroller, integrated circuit or other type of circuit.

Memory interface 239 is an electrical interface between control die 204 and memory die 202, employing pathways 237. Pathways 237 are pathways between one or more components in the control circuitry 210 and the memory structure on memory die 202. A portion of each pathway resides in memory die 202 and a portion of each pathway resides in control die 204. The term pathway may be used for a portion of pathways 237 that is entirely within one of the die. Thus, it may be stated that the memory die 202 has a first plurality of pathways and that the control die 204 has a second plurality of pathways such that the first plurality of pathways are directly connected to the second plurality of pathways (e.g., no intervening pathways). In one embodiment, the control die 204 and the memory die 202 are configured to transfer signals through pathway pairs of the first plurality of pathways and the second plurality of pathways. In some embodiments, the memory die 202 and the control die 204 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. In one embodiment, pathways 237 allow the control circuitry 210 to provide voltages to word lines, select lines, and bit lines on memory die 202. Pathways 237 may be used to receive signals from, for example, bit lines. In one embodiment, there are about 100,000 pathways 237. However, there could be more or fewer than 100,000 pathways. Having such a large number of pathways 237 allows a very large amount of data, or other signals, to be passed in parallel.

Memory controller interface 232 is an electrical interface for communicating with memory controller 120. For example, memory controller interface 232 may implement a Toggle Mode Interface that connects to the Toggle Mode interfaces of memory interface 228/258 for memory controller 120. In one embodiment, memory controller interface 232 includes a set of input and/or output (I/O) pins that connect to communication channel 236 (also refers to herein as a data bus). In one embodiment, communication channel 236 connects to the memory controller 120 as part of the Toggle Mode Interface. In one embodiment, a communication channel 236 of one integrated memory assembly 104 connects to another integrated memory assembly 104.

Memory interface 239 is significantly wider than memory controller interface 232 because memory interface 239 has significantly more signals than memory controller interface 232. Therefore, more data can be sent in parallel for memory interface 239 as compared to memory controller interface 232.

Communication channel 236 is depicted as being connected to integrated memory assembly 104 for generality. Communication channel 236 may connect to either or both of die 202 and/or 204. In one embodiment, communication channel 236 connects memory controller 120 directly to control die 204. In one embodiment, communication channel 236 connects memory controller 120 directly to memory die 202. If communication channel 236 connects memory controller 120 directly to memory die 202, then pathway 237 may be used to allow communication between memory controller 120 and control circuitry 210.

In one embodiment, memory structure 226 comprises a monolithic three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 226 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 226 is not limited to the examples above. Many different types of memory array architectures or memory technologies can be used to form memory structure 226. No particular non-volatile memory technology is required for purposes of the new claimed embodiments disclosed herein. Other examples of suitable technologies for memory cells of the memory structure 226 include phase change memory ("PCM"), Magnetoresistive Random-Access Memory ("MRAM"), and the like. Examples of suitable technologies for memory cell architectures of the memory structure 226 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

The elements of FIG. 2A can be grouped into two parts: (1) memory structure 226 and (2) control circuitry 210. Semiconductor fabrication of the memory structure 226 may be at odds with fabrication of the control circuitry 210, since these regions often involve differing processing technologies. For example, when the memory structure 226 is NAND flash, this is an NMOS structure, while the control circuitry 210 is often CMOS based. For example, elements such sense amplifier circuits, charge pumps, logic elements in a state machine, and other circuitry in control circuitry 210 often employ PMOS devices. Processing operations for manufacturing a CMOS die will differ in many aspects from the processing operations optimized for an NMOS flash NAND memory or other memory cell technologies. Thus, forming the memory structure 226 on the memory die 202 and forming the control circuitry 210 on the control die 204 overcomes such limitations. This allows the memory die 202 and the control die 204 to be optimized individually according to its technology. For example, a NAND memory structure die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the control circuitry on the other die.

Figure 2B:
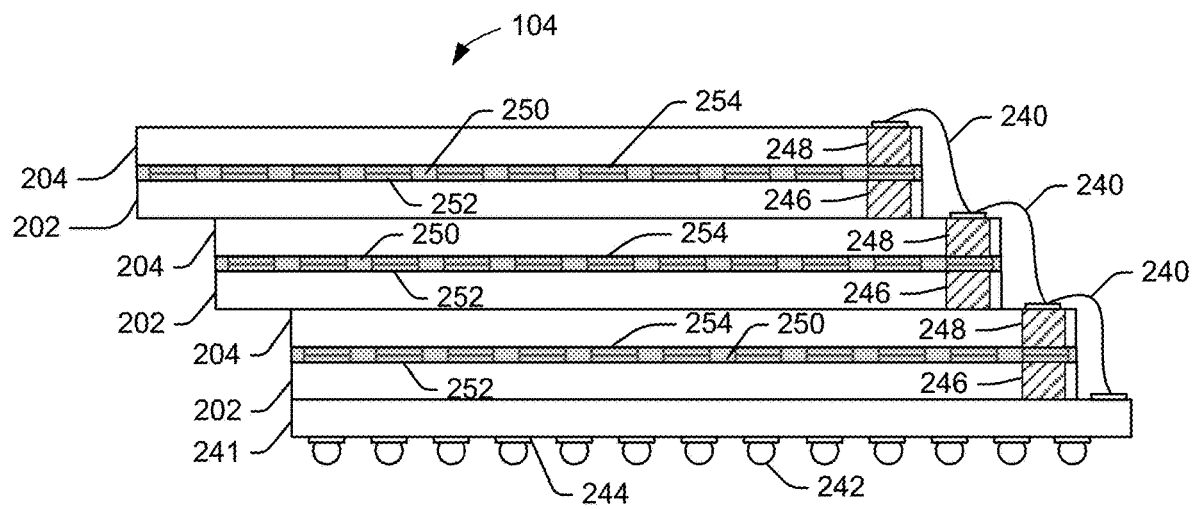
FIGS. 2B and 2C depict side views of embodiments of an integrated memory assembly.

Although FIG. 2A depicts one control die 204 and one memory die 202 in an integrated memory assembly 104, there may be more than one control die 204 and more than one memory die 202 in an integrated memory assembly 104. In some embodiments, the integrated memory assembly 104 includes a stack of multiple control die 204 and multiple memory die 202. FIG. 2B depicts a side view of an embodiment of an integrated memory assembly 104 stacked on a substrate 241 (e.g., a stack comprising control die 204 and memory die 202). The integrated memory assembly 104 has three control die 204 and three memory die 202. In some embodiments, there are more than three memory die 202 and more than three control die 204.

Each control die 204 is affixed (e.g., bonded) to at least one of the memory die 202. Some of the bond pads 252/254 are depicted. There may be many more bond pads. A space between two die 202, 204 that are bonded together is filled with a solid layer 250, which may be formed from epoxy or other resin or polymer. This solid layer 250 protects the electrical connections between the die 202, 204, and further secures the die together. Various materials may be used as solid layer 250, but in embodiments, it may be Hysol epoxy resin from Henkel Corp., having offices in California, USA.

The integrated memory assembly 104 may for example be stacked with a stepped offset, leaving the bond pads at each level uncovered and accessible from above. Wire bonds 240 connected to the bond pads connect the control die 204 to the substrate 241. A number of such wire bonds may be formed across the width of each control die 204 (i.e., into the page of FIG. 2B).

A memory die through silicon via (TSV) 246 may be used to route signals through a memory die 202. A control die through silicon via (TSV) 248 may be used to route signals through a control die 204. The TSVs 246, 248 may be formed before, during or after formation of the integrated circuits in the semiconductor die 202, 204. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 242 may optionally be affixed to contact pads 244 on a lower surface of substrate 241. The solder balls 242 may be used to couple the integrated memory assembly 104 electrically and mechanically to a host device such as a printed circuit board. Solder balls 242 may be omitted where the integrated memory assembly 104 is to be used as an LGA package. The solder balls 242 may form a part of the interface between integrated memory assembly 104 and memory controller 120.

Figure 2C:
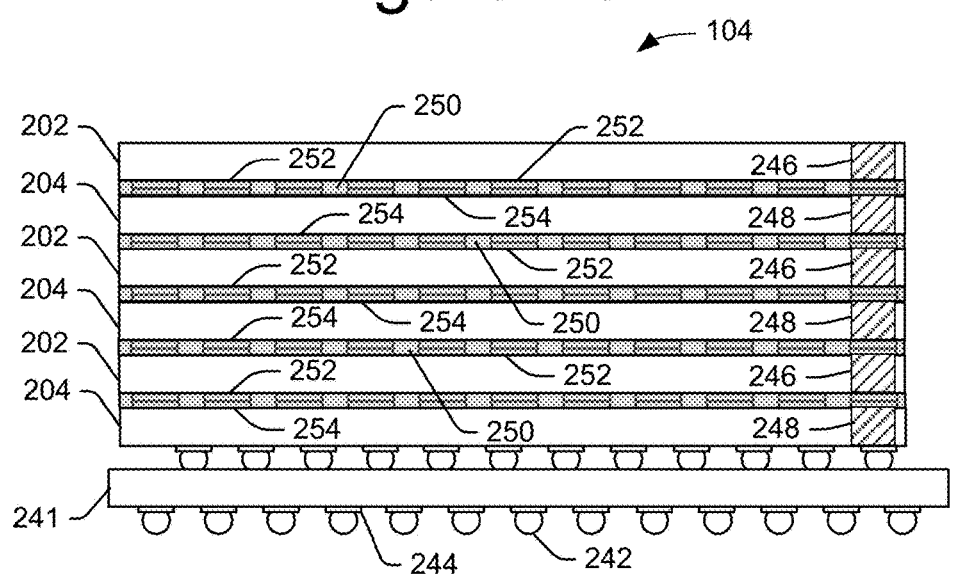

FIG. 2C depicts a side view of another embodiment of an integrated memory assembly 104 stacked on a substrate 241. The integrated memory assembly 104 of FIG. 2C has three control die 204 and three memory die 202. In some embodiments, there are many more than three memory die 202 and many more than three control die 204. In this example, each control die 204 is bonded to at least one memory die 202. Optionally, a control die 204 may be bonded to two or more memory die 202.

Some of the bond pads 252, 254 are depicted. There may be many more bond pads. A space between two die 202, 204 that are bonded together is filled with a solid layer 250, which may be formed from epoxy or other resin or polymer. In contrast to the example in FIG. 2B, the integrated memory assembly 104 in FIG. 2C does not have a stepped offset. A memory die through silicon via (TSV) 246 may be used to route signals through a memory die 202. A control die through silicon via (TSV) 248 may be used to route signals through a control die 204.

Solder balls 242 may optionally be affixed to contact pads 244 on a lower surface of substrate 241. The solder balls 242 may be used to couple the integrated memory assembly 104 electrically and mechanically to a host device such as a printed circuit board. Solder balls 242 may be omitted where the integrated memory assembly 104 is to be used as an LGA package.

As has been briefly discussed above, the control die 204 and the memory die 202 may be bonded together. Bond pads on each die 202, 204 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the die 202, 204. Where no such film is initially provided, a space between the die may be under filled with an epoxy or other resin or polymer. The under-fill material may be applied as a liquid which then hardens into a solid layer. This under-fill step protects the electrical connections between the die 202, 204, and further secures the die together. Various materials may be used as under-fill material, but in embodiments, it may be Hysol epoxy resin from Henkel Corp., having offices in California, USA.

Figure 2D:
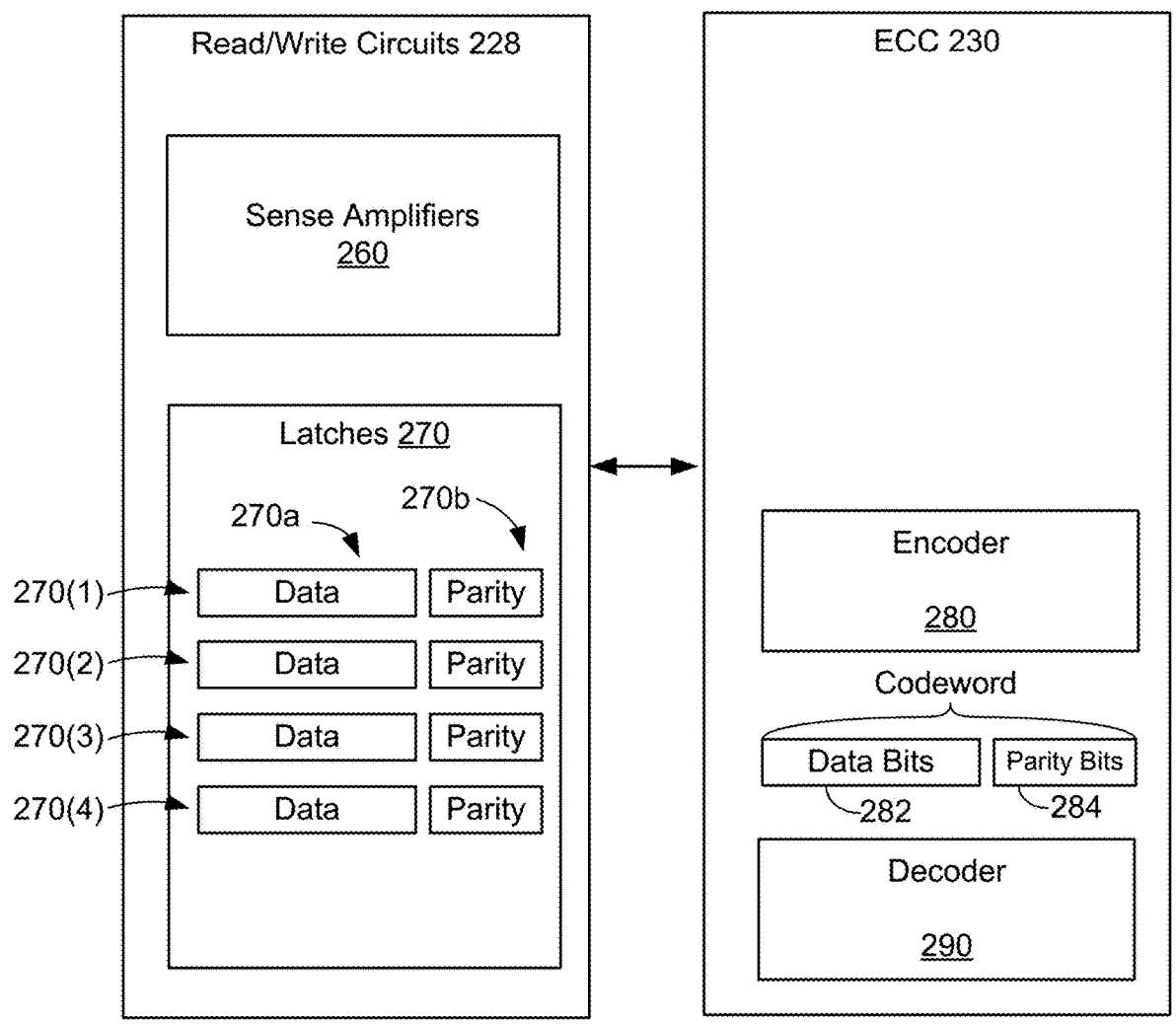
FIG. 2D is a block diagram of one embodiment of a read/write circuits and ECC circuit of an integrated memory assembly.

FIG. 2D is a block diagram of one embodiment of the read/write circuits 228 and ECC engine 230 of the control die 204. The read/write circuits 228 have sense amplifiers 260 and latches 270. The latches 270 may include data latches 270a and parity latches 270b. In one embodiment, the data latches 270a store data bits of the codeword and the parity latches store parity bits of the codeword. It is not required that there be specific latches for data bits and for parity bits. FIG. 2D depicts four sets of data latches 270(1), 270(2), 270(3), 270(4). In one embodiment, each set of data latches stores one page of data. In one embodiment, each set may be used to store one or more codewords for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In an embodiment in which three bits are stored per memory cell, three pages are stored in a set of memory cells and the four pages may be referred to as a lower page (LP), middle page (MP), and an upper page (UP). In another embodiment, the sense amplifiers 260 are on the memory die 202, but the latches 270 remain on the control die 204.

The on-die ECC engine 230 is able to encode data bits received from memory controller 120. In one embodiment, the on-die ECC engine 230 forms codewords that each contain data bits and parity bits. In one embodiment, memory controller 120 provides the codewords to the control die 204. Control circuitry 210 stores the codewords into non-volatile memory cells in the memory structure 226. Upon a request from memory controller 120 to read data, control circuitry 210 reads codewords from memory structure 226. The on-die ECC engine 230 is also able to decode and error correct the codewords read from the memory structure 226. In some embodiments, the on-die ECC engine 230 calculates parity bits for each unit of data (e.g., fragment) that is being stored. The parity bits (also referred to as an error correction code or error correction information) may be stored with the unit of data (e.g., fragment). The combination of the unit of data and its associated parity bits are referred to as a codeword. In one embodiment, the parity bits are stored remotely from the unit of data.

The on die ECC engine 230 includes an encoder 280 and a decoder 290. The encoder 280 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. The encoder 280 may form a codeword, which contains data bits 282 and parity bits 284. The data bits may be provided by memory controller 120.

Based on the bits in the latches 270, the sense amplifiers 260 may control bit line voltages in the memory structure 226 when the non-volatile memory cells are being programmed. In this manner, the codewords may be programmed into non-volatile memory cells in the memory structure 226. It will be appreciated that other voltages may also be applied to the memory structure 226, such applying a program voltage to memory cells that are selected for programming by a voltage generator on control die 204 applying the program voltage and boosting voltages to various word lines of memory structure 226. Decoder 290 is configured to decode the codewords that were stored in the memory die 202. In one embodiment, sense amplifiers 260 sense bit lines in the memory structure 226 in order to read a codeword. The sense amplifiers 260 may store the read codeword into latches 270. The decoder 290 is able to detect and correct errors in the codeword. In one embodiment, the decoder 290 is a relatively low power decoder, as compared to a decoder on memory controller 120. In one embodiment, the decoder on memory controller 120 is able to correct more bit errors in the codeword than can typically be corrected by decoder 290. Thus, decoder 290 may provide a power versus error correction capability tradeoff. For example, decoder 290 may be very efficient with respect to power consumption, but at the expense of possibly not being able to correct a high number of errors in a codeword.

In one embodiment, the decoder 290 implements a hard bit decoder. In another embodiment, the decoder 290 implements a soft bit decoder. Alternatively, decoder 290 may implement both a hard bit decoder and a soft bit decoder. For example, the control die 204 may first attempt to decode a codeword with the hard bit decoder. If that fails, then the control die 204 may attempt to decode using the soft bit decoder.

Figure 3:
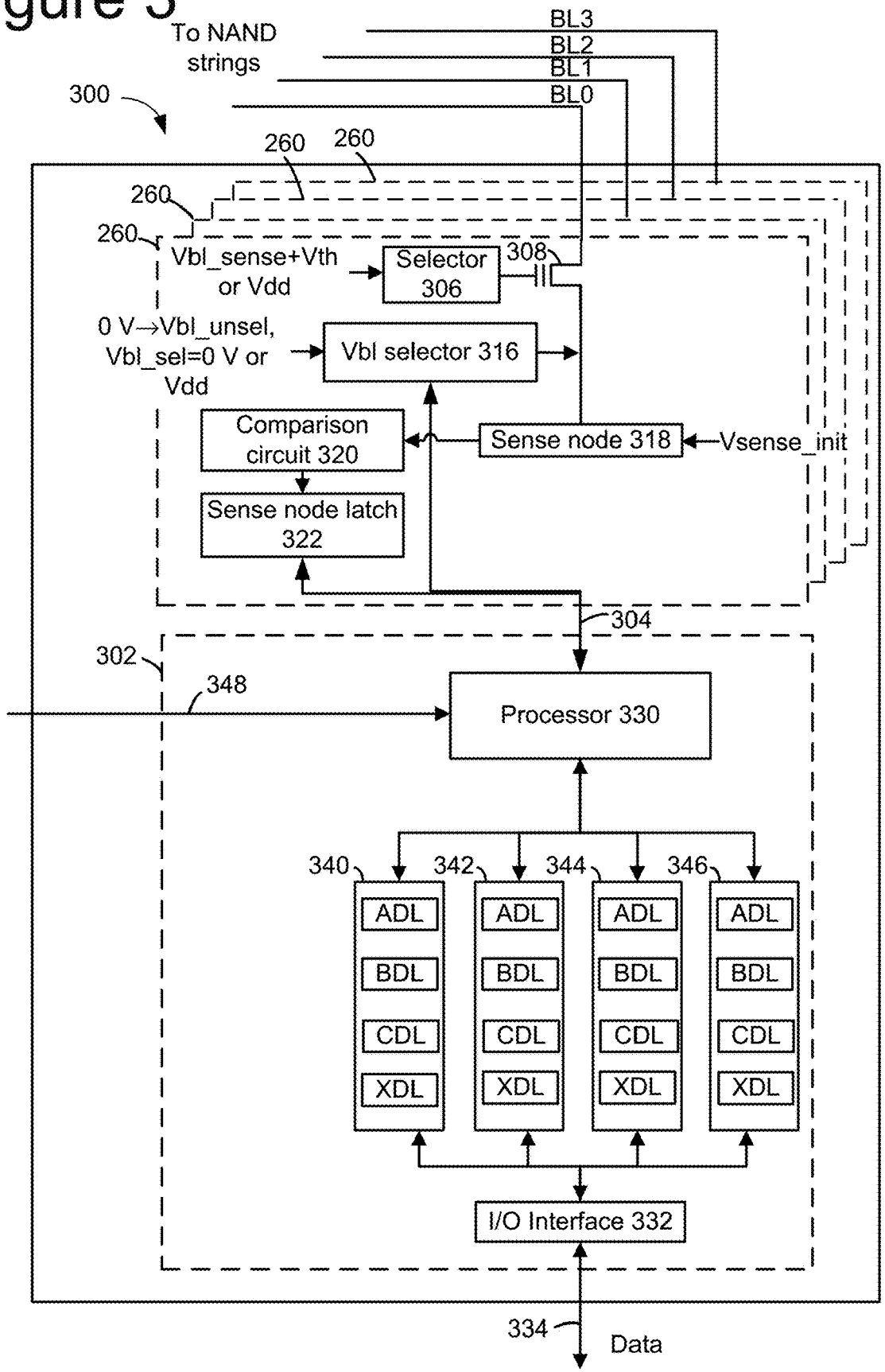
FIG. 3 is a block diagram depicting one embodiment of a sense block.

FIG. 3 is a block diagram depicting one embodiment of a sense block 300. There a typically a number of such sense blocks 300 in the read/write circuits 228. An individual sense block 300 is partitioned into one or more core portions, referred to as sense circuits or sense amplifiers 260, and a common portion, referred to as a managing circuit 302. In one embodiment, there will be a separate sense circuit for each bit line/NAND string and one common managing circuit 302 for a set of multiple, e.g., four or eight, sense circuits. Each of the sense circuits in a group communicates with the associated managing circuit by way of data bus 304. Thus, there are one or more managing circuits which communicate with the sense circuits of a set of storage elements (memory cells).

The sense amplifier 260 comprises sense circuitry that performs sensing by determining whether a conduction current in a connected bit line is above or below a predetermined threshold level. The sensing can occur in a read or verify operation. The sense circuit also supplies a bit line voltage during the application of a program voltage in a program operation (e.g., write operation).

The sense circuitry may include a Vbl selector 306, a sense node 318, a comparison circuit 320 and a trip latch 322. During the application of a program voltage, the Vbl selector 306 can pass a program enable voltage (e.g., V_pgm enable) or a program-inhibit voltage (e.g., Vbl_inh) to a bit line connected to a memory cell. The Vbl selector 306 can also be used during sensing operations. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line. The bit lines are part of memory structure 226 on memory die 202.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 308 (e.g., an nMOS) can be configured as a pass gate to pass Vbl from the Vbl selector 306, by setting the control gate voltage of the transistor sufficiently high, e.g., higher than the Vbl passed from the Vbl selector. For example, a selector 306 may pass a power supply voltage Vdd, e.g., 3-4 V to the control gate of the transistor 308.

The sense amplifier 260 is configured to control the timing of when the voltages are applied to the bit line. During sensing operations such as read and verify operations, the bit line voltage is set by the transistor 308 based on the voltage passed by the selector 306. The bit line voltage is roughly equal to the control gate voltage of the transistor minus its Vt (e.g., 3 V). For example, if Vbl+Vt is passed by the selector 306, the bit line voltage will be Vbl. This assumes the source line is at 0 V. The transistor 308 clamps the bit line voltage according to the control gate voltage and acts as a source-follower rather than a pass gate.

The Vbl selector 306 may pass a relatively high voltage such as Vdd which is higher than the control gate voltage on the transistor 308 to provide the source-follower mode. During sensing, the transistor 308 thus charges up the bit line.

In one approach, the selector 316 of each sense amplifier can be controlled separately from the selectors of other sense amplifiers, to pass Vbl or Vdd. The Vbl selector 306 of each sense amplifier can also be controlled separately from the Vbl selectors of other sense amplifiers.

During sensing, the sense node 318 is charged up to an initial voltage such as Vsense_init=3 V. The sense node is then connected to the bit line by way of the transistor 308, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 320 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 260(1) includes a trip latch 322 that is set by the comparison circuit 320 based on whether the memory cell is in a conductive or non-conductive state. The data in the trip latch can be a bit which is read out by the processor 330.

The managing circuit 302 comprises a processor 330, four example sets of data latches 340, 342, 344, 346 and an I/O Interface 332 coupled between the sets of data latches and data bus 334 (data bus may connect to memory controller 120). One set of data latches, e.g., comprising individual latches ADL, BDL, CDL, XDL, can be provided for each sense amplifier. In some cases, fewer or additional data latches may be used. ADL stores a bit for a lower page of data, BDL stores a bit for a middle page of data, CDL stores a bit for an upper page of data. This is in an eight level or three bit per memory cell memory device. In one embodiment, there are sixteen levels or four bits per memory cell, in which case there will be one additional latch per sense amplifier 260. The XDL latches are used as input/output latches.

The processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between the XDL data latches and the data bus 334.

The processor 330 may also be used to determine what voltage to apply to the bit line, based on the state of the latches.

During reading, the operation of the system is under the control of state machine 212 that controls the supply of different control gate voltages to the addressed memory cell (e.g., by applying voltages from power control 216 to word lines on the memory structure 226 by way of the pathways between control die 204 and memory die 202 discussed herein). As it steps through the various predefined control gate voltages corresponding to the various memory states supported by the memory, the sense circuit may trip at one of these voltages and a corresponding output will be provided from sense circuit to processor 330 by way of the data bus 304. At that point, processor 330 determines the resultant memory state by consideration of the tripping event(s) of the sense circuit and the information about the applied control gate voltage from the state machine by way of input lines 348. It then computes a binary encoding for the memory state and stores the resultant data bits into data latches 340-346.

Some implementations can include multiple processors 330. In one embodiment, each processor 330 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because (in one embodiment) each processor communicates with four sense amplifiers, the state machine needs to read the wired-OR line four times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334, in the ADL, BDL, and CDL latches in a three-bit per memory cell implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming. Each program voltage is followed by a verify operation to determine if the memory cells has been programmed to the desired memory state. In some cases, processor 330 monitors the read back memory state relative to the desired memory state. When the two agree, the processor 330 sets the bit line in a program inhibit mode such as by updating its latches. This inhibits the memory cell coupled to the bit line from further programming even if additional program pulses are applied to its control gate.

Each set of data latches 340-346 may be implemented as a stack of data latches for each sense amplifier. In one embodiment, there are three data latches per sense amplifier 260. In some implementations, the data latches are implemented as a shift register so that the parallel data stored therein is converted to serial data for data bus 334, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operation. For example, latches may identify that a memory cell's Vt is below a particular verify voltage. The data latches indicate whether a memory cell currently stores one or more bits from a page of data. For example, the ADL latches can be used to store a lower page of data. An ADL latch is flipped (e.g., from 0 to 1) when a lower page bit is stored in an associated memory cell. A BDL or CDL latch is flipped when a middle or upper page bit, respectively, is stored in an associated memory cell. This occurs when an associated memory cell completes programming.

Figure 4:
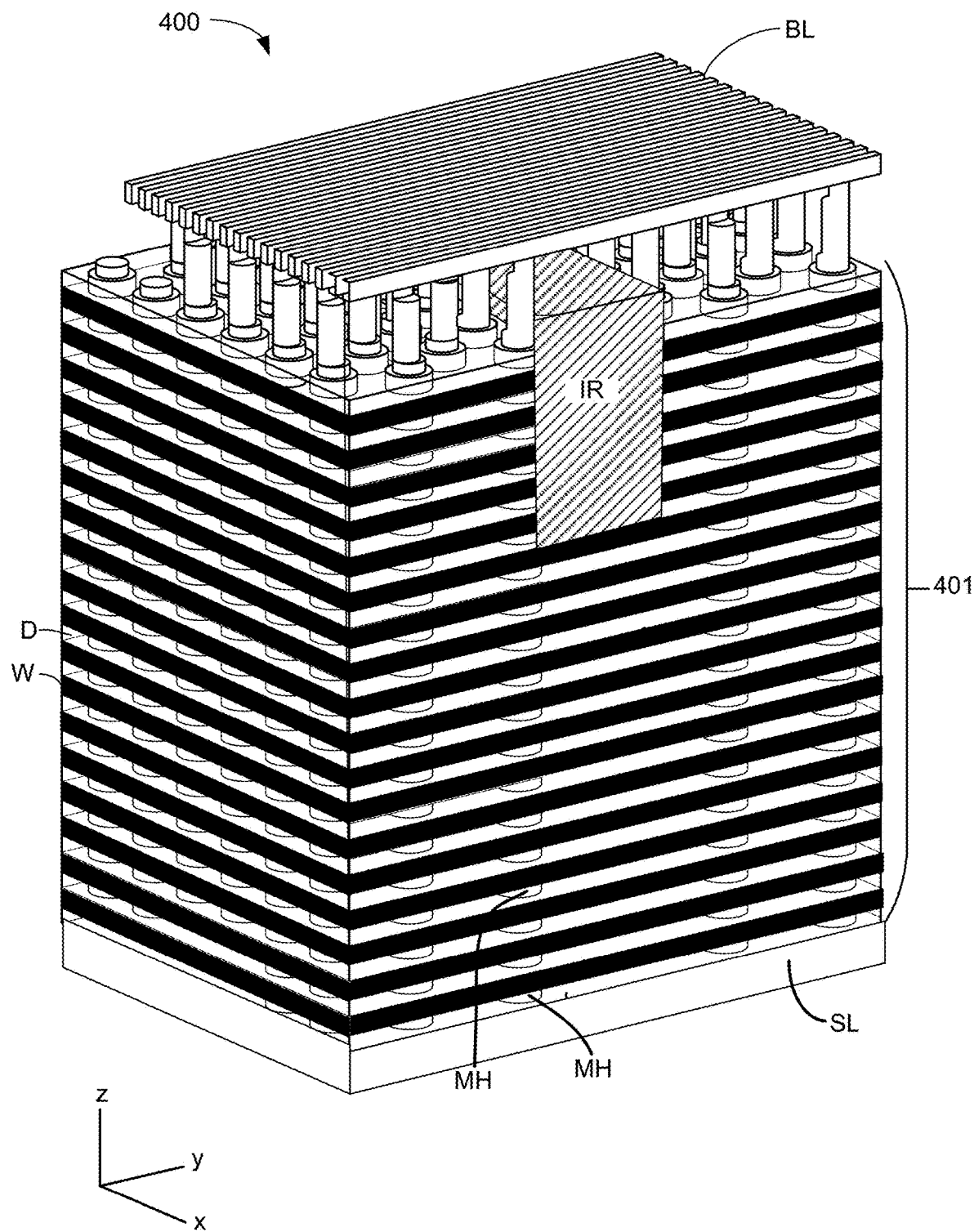
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 226, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

Figure 4A:
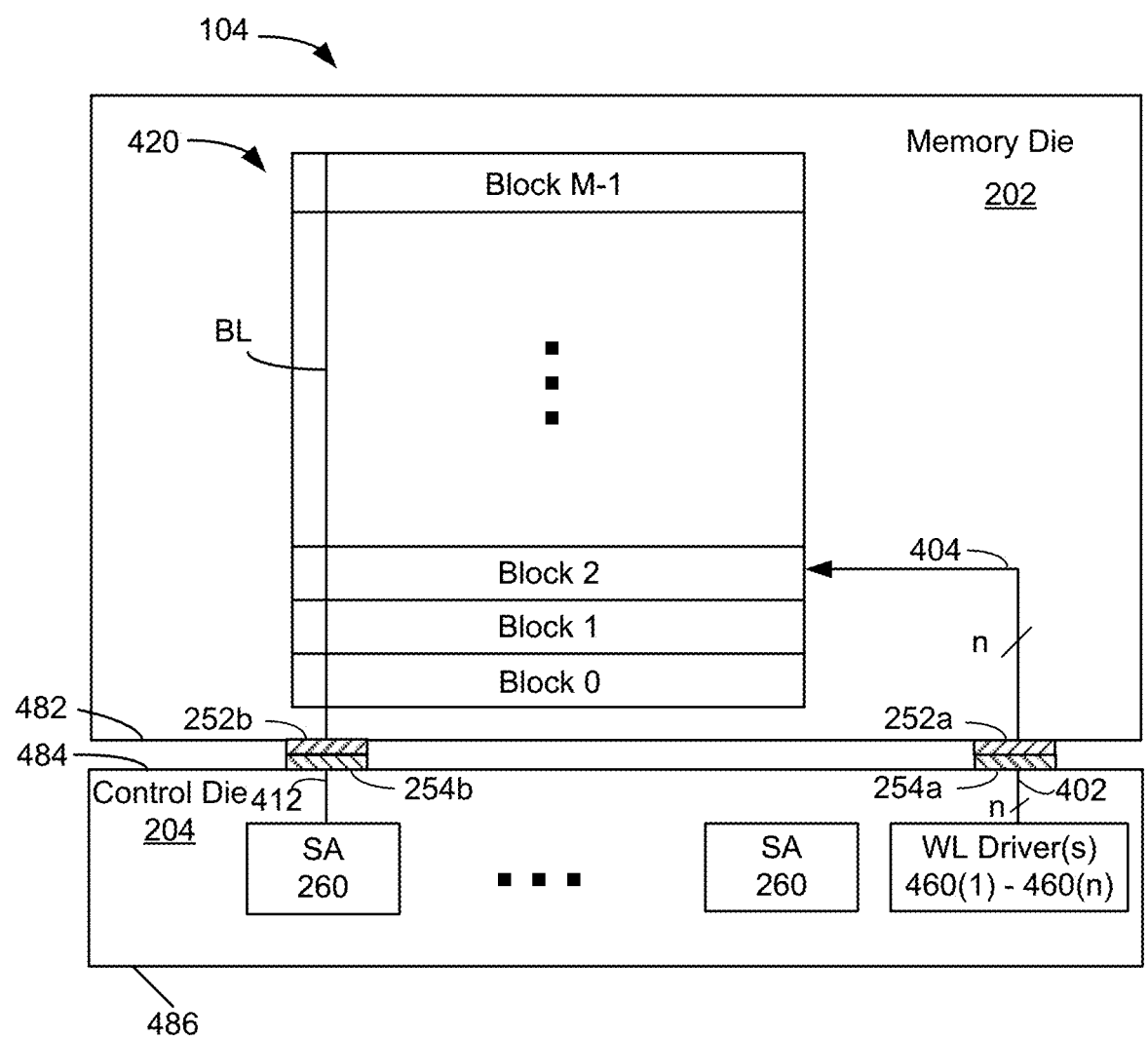
FIG. 4A is a block diagram of one embodiment of an integrated memory assembly.

FIG. 4A is a block diagram of one embodiment of an integrated memory assembly 104. FIG. 4A depicts further details of one embodiment of the integrated memory assembly 104 of FIGS. 1, 2A, 2B, and 2C. Memory die 202 contains a plane 420 of memory cells. The memory die 202 may have additional planes. The plane is divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows one planes 420, more or fewer planes can be implemented. In some embodiments, memory structure 226 includes eight planes.

One representative bit line (BL) is depicted for the plane. There may be thousand or tens of thousands of such bit lines per each plane. Each block may be divided into a number of word lines. In one embodiment, a block represents a groups of connected memory cells as the memory cells of a block share a common set of unbroken word lines and unbroken bit lines. In the structure of FIG. 4A, Block 0 and Block M−1 of plane 420 are at the edges of the memory structure (or otherwise referred to as being located in an edge region/section of the memory structure).

Control die 204 includes a number of sense amplifiers (SA) 260. Each sense amplifier 260 is connected to one bit line. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 204 includes a number of word line drivers 460(1)-460(n). The word line drivers 460 are configured to provide voltages to word lines. In this example, there are "n" word lines per block of memory cells. In one embodiment, one of the blocks in the plane 420 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 460 (e.g. part of Power Control 216) provide voltages to the word lines in a first selected block (e.g., Block 2) in memory die 202. The control die 204 may also include charge pumps, voltage generators, and the like, which may be used to provide voltages for the word line drivers 460 and/or the bit line drivers.

The memory die 202 has a number of bond pads 252a, 252b on a first major surface 482 of memory die 202. There may be "n" bond pads 252a, to receive voltages from a corresponding "n" word line drivers 460(1)-460(n). There may be one bond pad 252b for each bit line associated with plane 420. The reference numeral 252 will be used to refer in general to bond pads on major surface 482.

In some embodiments, each data bit and each parity bit of a codeword are transferred through a different bond pad pair 252b, 254b. The bits of the codeword may be transferred in parallel over the bond pad pairs 252b, 254b. There may be more bond pad pairs 252b, 254b than bits in the codeword, such that more than one codeword may be transferred in parallel over the bond pad pairs 252b, 254b. In an embodiment, there are a sufficient number of bond pad pairs 252b, 254b such that the data for a unit of programming (e.g., page) may be transferred in parallel through the bond pad pairs 252b, 254b from the control die 204 to the bit lines in the memory die 202. Likewise, there may be a sufficient number of bond pad pairs 252b, 254b such that the data for a unit of reading (e.g., page) may be transferred in parallel through the bond pad pairs 252b, 254b by the sense amplifiers 260 sensing the bit lines in the memory die 202. Stated another way, a page of bit lines may be sensed in parallel.

The bond pad pairs 252b, 254b provide for a very efficient data transfer relative to, for example, transferring data between the memory controller 120 and the integrated memory assembly 104. For example, the data bus between the memory controller 120 and the integrated memory assembly 104 may, for example, provide for eight, sixteen, or perhaps 32 bits to be transferred in parallel. However, the data bus between the memory controller 120 and the integrated memory assembly 104 is not limited to these examples.

The control die 204 has a number of bond pads 254a, 254b on a first major surface 484 of control die 204. There may be "n" bond pads 254a, to deliver voltages from a corresponding "n" word line drivers 460(1)-460(n) to memory die 202. There may be one bond pad 254b for each bit line associated with plane 420. The reference numeral 254 will be used to refer in general to bond pads on major surface 484. Note that there may be bond pad pairs 252a/254a and bond pad pairs 252b/254b. In some embodiments, bond pads 252 and/or 254 are flip-chip bond pads.

In one embodiment, the pattern of bond pads 252 matches the pattern of bond pads 254. Bond pads 252 are bonded (e.g., flip chip bonded) to bond pads 254. Thus, the bond pads 252, 254 electrically and physically couple the memory die 202 to the control die 204. Also, the bond pads 252, 254 permit internal signal transfer between the memory die 202 and the control die 204. Thus, the memory die 202 and the control die 204 are bonded together with bond pads. Although FIG. 4A depicts one control die 204 bonded to one memory die 202, in another embodiment one control die 204 is bonded to multiple memory dies 202. For example, major surface 486 may also have bond pads in order to bond to another memory die 202.

Herein, "internal signal transfer" means signal transfer between the control die 204 and the memory die 202. The internal signal transfer permits the circuitry on the control die 204 to control memory operations in the memory die 202. Therefore, the bond pads 252, 254 may be used for memory operation signal transfer. Herein, "memory operation signal transfer" refers to any signals that pertain to a memory operation in a memory die 202. A memory operation signal transfer could include, but is not limited to, providing a voltage, providing a current, receiving a voltage, receiving a current, sensing a voltage, and/or sensing a current.

The bond pads 252, 254 may be formed for example of copper, aluminum and alloys thereof. There may be a liner between the bond pads 252, 254 and the major surfaces (482, 484). The liner may be formed for example of a titanium/titanium nitride stack. The bond pads 252, 254 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 252, 254. Several conductive pathways, which may be implemented with metal interconnects and/or vias are depicted. For example, a sense amplifier 260 may be electrically connected to bond pad 254b by pathway 412. There may be thousands of such sense amplifiers, pathways, and bond pads. The word line drivers 460 may be electrically connected to bond pads 254a by pathways 402. Note that pathways 402 may comprise a separate conductive pathway for each word line driver 460(1)-460(n). Likewise, there may be a separate bond pad 254a for each word line driver 460(1)-460(n). The word lines in block 2 of the memory die 202 may be electrically connected to bond pads 252a by pathways 404. In FIG. 4A, there are "n" pathways 404, for a corresponding "n" word lines in a block. There may be a separate pair of bond pads 252a, 254a for each pathway 404.

Figure 5A:
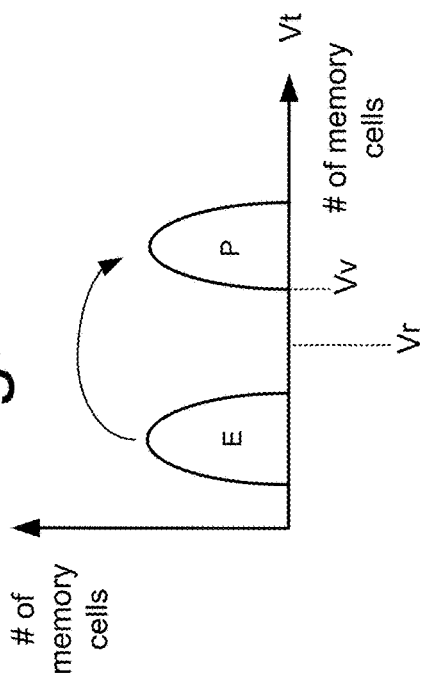
FIGS. 5A and 5B depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
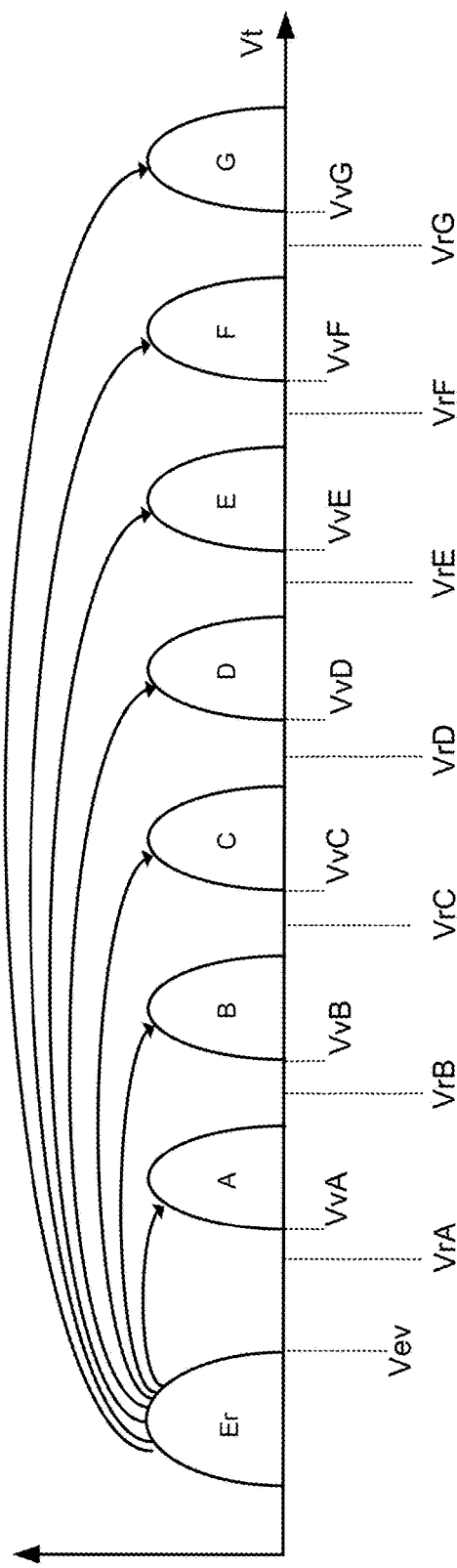

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5B represent the full sequence programming. In some embodiments, data states A-G can overlap, with control die 204 and/or memory controller 120 relying on error correction to identify the correct data being stored. Note that in some embodiments, rather than using full sequence programming, the system can use multi-pass programming processes known in the art.

Figure 6:
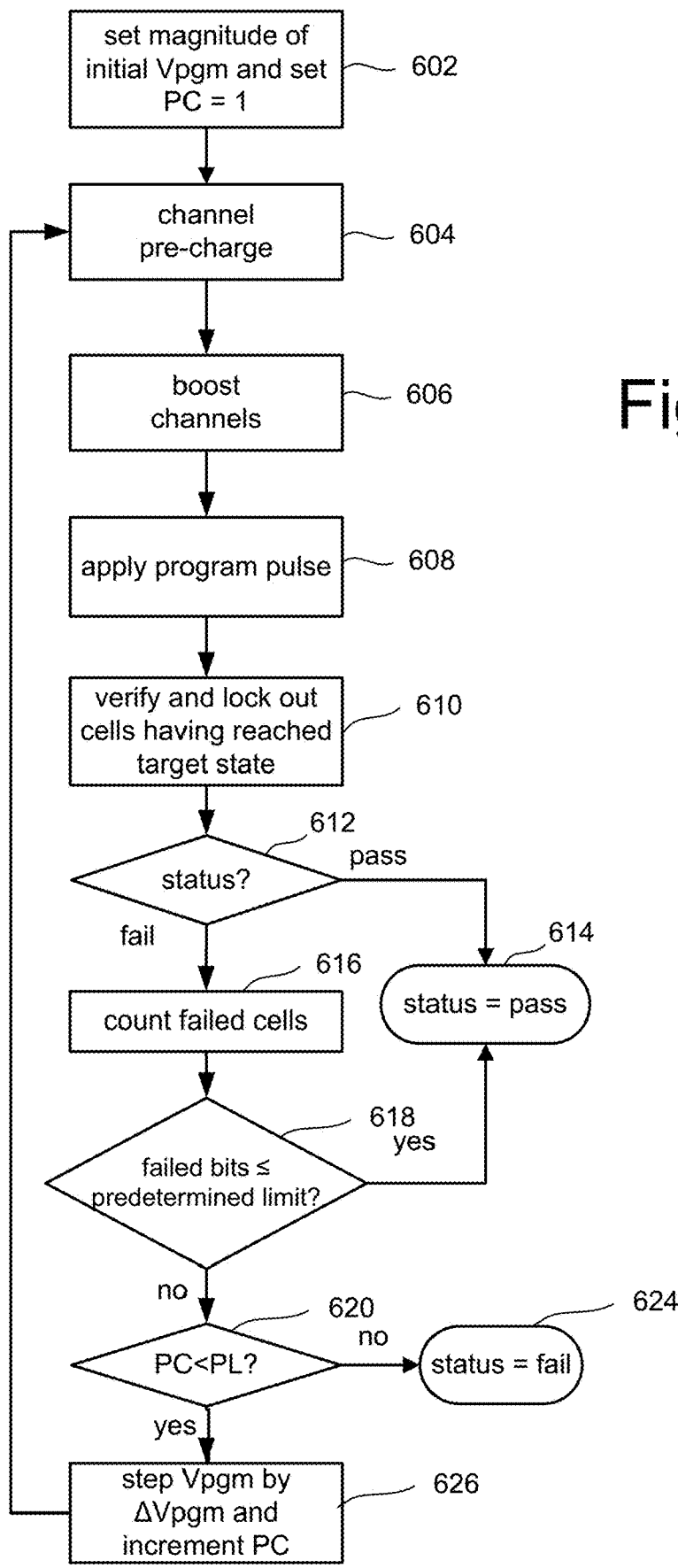
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 226 using the one or more control circuits (e.g., control circuitry 210) discussed above. In one example embodiment, the process of FIG. 6 is performed by integrated memory assembly 104 using the one or more control circuits (e.g., control circuitry 210) of control die 204 to program memory cells on memory die 202. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control terminals (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 212 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify high voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 212, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

Figure 7:
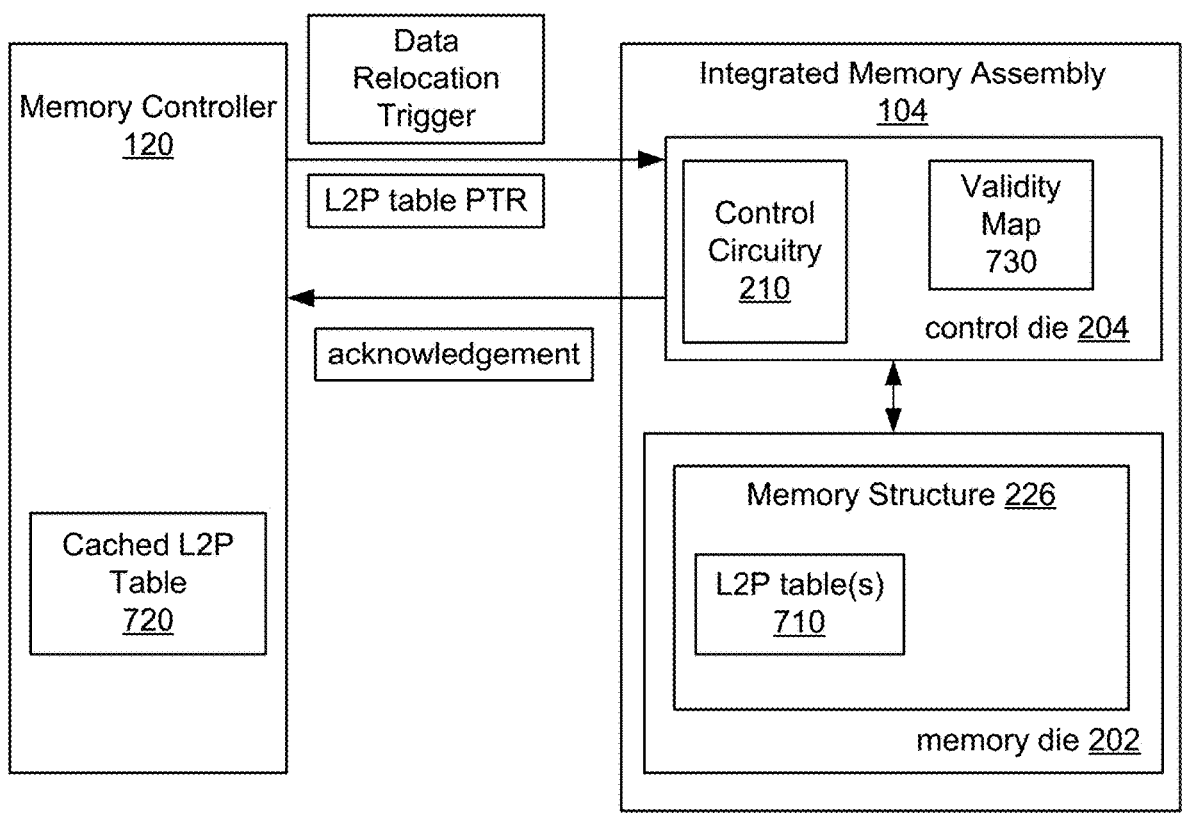
FIG. 7 is a block diagram of one embodiment of a storage system having data auto-relocation in an integrated memory assembly.

FIG. 7 is a block diagram of one embodiment of a storage system with data auto-relocation in an integrated memory assembly 104. FIG. 7 shows memory controller 120 in communication with one or more integrated memory assemblies 104. In one example, each integrated memory assembly 104 includes a memory die 202 bonded to a control die 204, as described above. Some embodiments can include multiple memory die connected to a control die. Control die 204 includes the control circuitry 210 mentioned above. The control circuitry 210 may be referred to as one or more control circuits.

Memory die 202 includes a memory structure 226, as described above. Memory structure 226 may include a memory structure such as depicted in FIG. 4. In the embodiment of FIG. 7, the memory controller 120 sends a data relocation trigger to the control die 204, which triggers the control die 204 to relocate data in the memory structure 226. In one embodiment, the trigger includes a data compaction command. The memory controller 120 also sends the control die 204 a pointer to an L2P table 710 that is stored in the memory structure 226. A portion of the L2P table 710 is cached on the memory controller (cached L2P table 720). Note that the L2P table 710 may be arranged as multiple tables.

The control circuitry 210 on the control die 204 relocates data from a first set of physical addresses in the memory structure 226 to a second set of physical addresses in the memory structure 226. In one embodiment, the control circuitry 210 compacts the data such that one or more gaps in the data at the first set of physical addresses are removed. In an embodiment, the control circuitry 210 updates the L2P table 710 after relocating the data. For example, the data that is moved will remain associated with the same logical addresses both pre- and post-relocation. However, the physical addresses in the L2P table 710 are changed from the first set of physical addresses to the second set of physical addresses. Hence, the control circuitry 210 changes the logical address to physical address mapping to reflect to data relocation. After updating the L2P table 710, the control circuitry 210 stores the update to the memory structure 226. The control die 204 sends an acknowledgement message to the memory controller 120 after the data relocation and L2P table update. The control die 204 may update the L2P table 710 without transferring data to the memory controller 120. Therefore, time and power is saved.

In one embodiment, the control circuitry 210 builds a validity map 730. In one embodiment, the validity map 730 includes a set of data for every physical block and/or every metablock. In an embodiment, the set of data for a block or metablock comprises an identification of each fragment and a flag indicating whether that fragment is valid data or invalid data. In an embodiment, the control circuitry 210 (software, an electrical circuit, or a combination of both), uses the validity map 730 to determine whether a block needs to be compacted. The control die 204 may build the validity map 730 without transferring data to the memory controller 120.

In one embodiment, the control circuitry 210 compacts data based on the validity map 730 that it built. The control die 204 may compact the data without transferring data to the memory controller 120. Therefore, time and power is saved.

Figure 8:
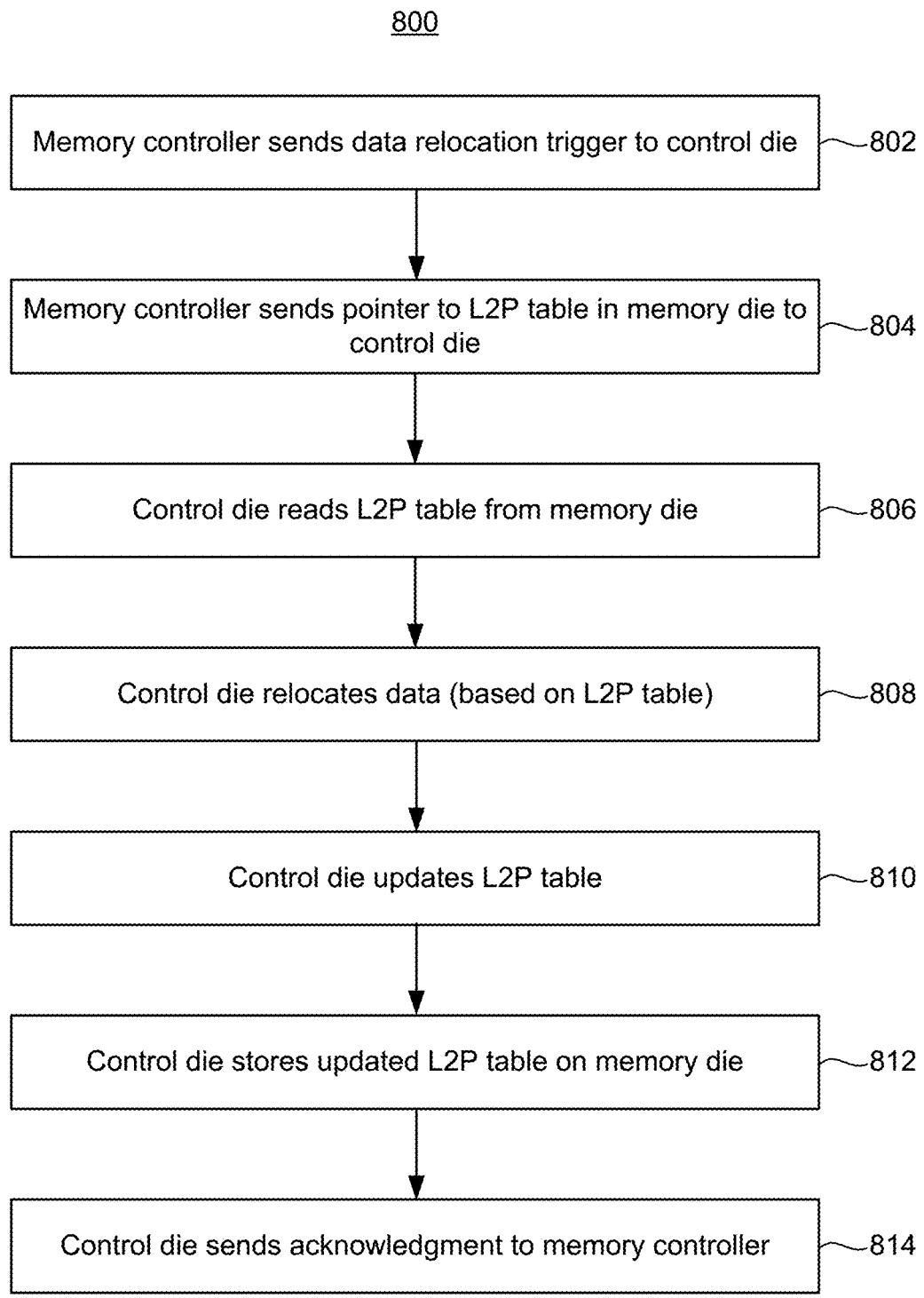
FIG. 8 is a flowchart of one embodiment of a process of auto-relocation of data in an integrated memory assembly.

FIG. 8 is a flowchart of one embodiment of a process 800 of auto-relocation of data in an integrated memory assembly. The process may be performed by a storage system 100 such as the storage system in FIG. 1 or FIG. 7.

Step 802 includes the memory controller 120 sending a data relocation trigger to the control die 204. In one embodiment, the data relocation trigger includes a data compaction command.

Step 804 includes the memory controller 120 sending a pointer to an L2P table on the memory die 202 to the control die 204. The L2P table 710 is stored in non-volatile memory cells in the memory structure 226. In one embodiment, rather than sending a pointer to the L2P table 710 the memory controller 120 sends a portion of the L2P table to the control die 204.

Step 806 includes the control die 204 reading the L2P table 710 from the memory die 202. The phrase "reading the L2P table" or the like, as used herein, does not require reading all information from the L2P table 710. Step 806 may include sensing a page of the memory cells in parallel. For example, with reference to FIG. 4A, a page of memory cells can be sensed in parallel by the sense amplifiers 260 sensing the bit lines.

Step 808 includes the control die 204 relocating data in the memory die 202. In one embodiment, data is relocated from a first set of physical addresses in the memory die 202 to a second set of physical addresses in the memory die 202 in response to the relocation trigger. This relocation may be based on information in the L2P table 710.

In one embodiment, the relocation include compacting data. Compacting the data may include moving data from a first set of physical addresses in the memory die to a second set of physical addresses in the memory die to remove one or more gaps in the data at the first set of physical addresses. Prior to compacting the data, the control die 204 may build a validity map 730. The control die 204 may use information in the L2P table 710 to build the validity map 730. In one embodiment, the control die 204 builds the validity map 730 based on associations between logical addresses and physical addresses in the L2P table 710.

Step 810 includes the control die 204 updating the L2P table 710. In one embodiment, the control die 204 updates the L2P table to associate the second set of physical addresses with logical addresses of data moved from the first set of physical addresses to the second set of physical addresses.

Step 812 includes the control die 204 storing the updated L2P table to the memory die 202. Step 812 may change the physical location of the updated portion of the L2P table on the memory die 202. Step 812 may include transferring a page of the L2P table to the memory die 202 in parallel. For example, with reference to FIG. 4A, the sense amplifiers 260 may be used to apply bit values to the bit lines.

Step 814 includes the control die 204 sending an acknowledgment message to the memory controller 120. This acknowledgment indicates that the data has been relocated. The acknowledgment also indicates that the L2P table 710 has been updated. The acknowledgment may also include a pointer to indicate a physical location of the updated portion of the L2P table.

In some embodiments, the data relocation includes data compaction. Some storage devices using the technology described above often (but not always) store data in blocks. For example, FIG. 4A shows a memory structure that includes a plane that includes a plurality of blocks (e.g., block 0, block 1, . . . block M−1). In the example of FIG. 4A, bit lines run across all of the blocks of plane 420 and each word line runs the width of one block. Other embodiments can have other arrangements. Typically, but not always, the memory cells can only be erased at the block level (e.g., an entire block at a time). As data is overwritten or deleted, the memory system may mark that overwritten or deleted data as invalid or stale. Over time, a block of memory cells may become fragmented such that groups of valid data may be separated by invalid data (e.g., data that was rewritten somewhere else, deleted etc.). This results in inefficient use of space in the memory array. As the amount of data stored in the memory approaches the capacity of the memory, the space wasted for the invalid data between fragments of valid data needs to be reclaimed.

Figure 9:
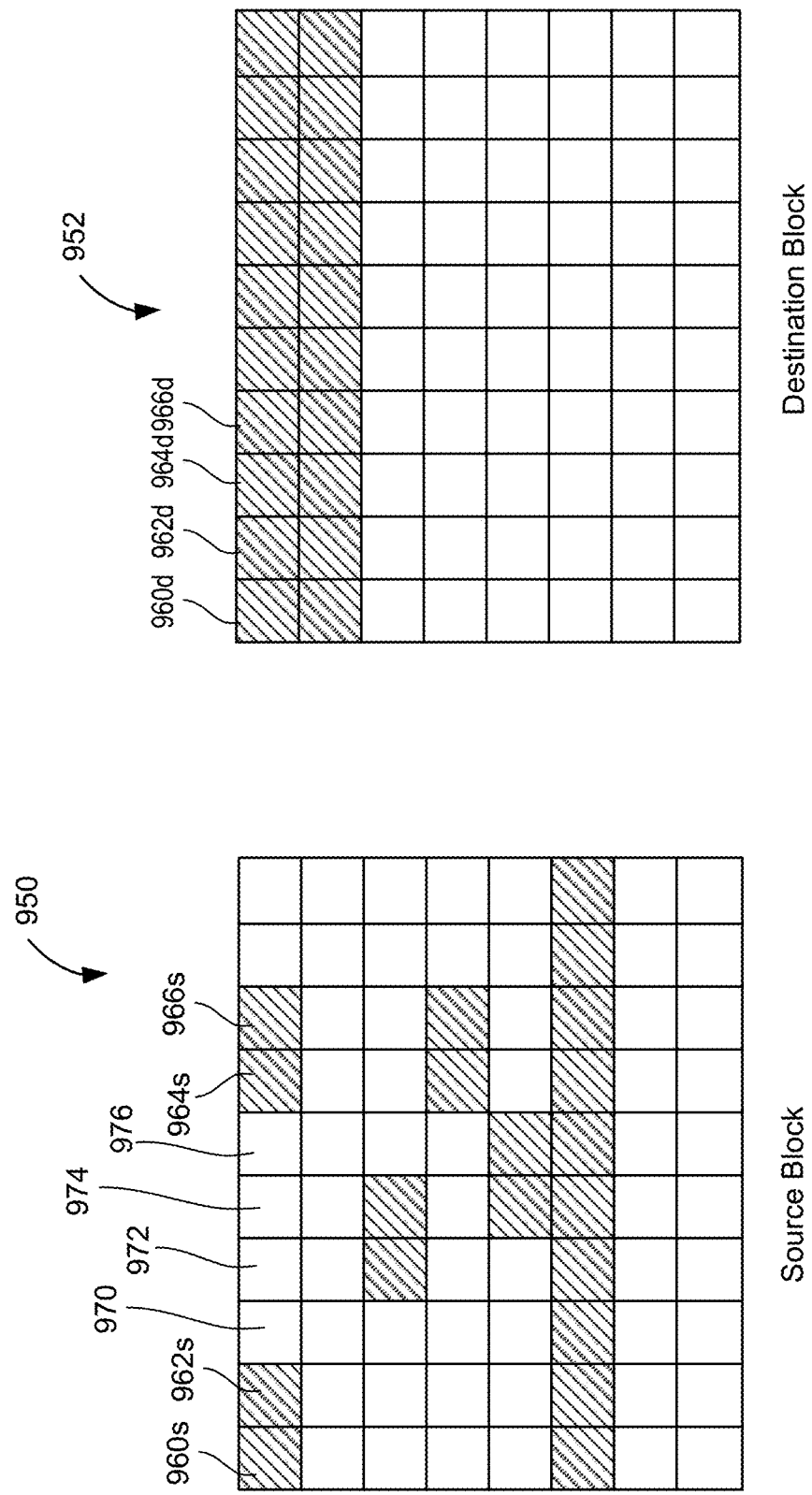
FIG. 9 provides an example of a how data can be compacted.

To address the inefficient use of space in the memory array due to fragmented data, a compaction process can be used to compact the valid data and re-write the compacted valid data in a different location, thereby, freeing up the source location to be reclaimed for another use. FIG. 9 provides an example of a how data can be compacted. In an embodiment, the data compaction is performed by the control die 204. FIG. 9 depicts a source block 950 and a destination block 952. In one embodiment, source block 950 and destination block 952 are each a single physical block on a single memory die 202. A physical block may be divided into pages. In one example, a page is the unit of programming and/or the unit of reading, and a page comprises data in memory cells connected to a same word line. In other examples, different units of programming and reading can be used, and different arrangements of pages can be used. In some embodiments, pages are divided into fragments (also referred flash management units). In some example implementations, a fragment is the unit of programming and/or the unit of reading. In an embodiment, each fragment corresponds to one ECC codeword. In one example implementation, a page is 16K of data and a fragment is 4K of data; however, other amounts can also be implemented. Each fragment represents data stored in memory cells. In another embodiment, source block 950 and destination block 952 are each metablocks. For purposes of this document, a metablock is a collection of physical blocks across planes (e.g., one physical block on each of a plurality of planes). A metablock may be divided into metapages. For purposes of this document, a metapage is a collection of pages across multiple planes (e.g., one page in a single block on each of a plurality of planes). A metapage exists in a metablock. Metapages comprise a plurality of fragments.

FIG. 9 shows source block 950 and destination block 952 divided into fragments. Each of the squares of source block 950 and destination block 952 are a fragment. For example, source block 950 includes fragments 960$s$, 962$s$, 964$s$, 966$s$, 970, 972, 974, 976, and other fragments not labeled. Fragments that are shaded represent valid data and fragments that are not shaded represent invalid data. For example, fragments 960$s$, 962$s$, 964$s$, and 966$s$ store valid data, and fragments 970, 972, 974, and 976 store invalid data. The valid data stored in source block 950 is fragmented as there are gaps between the valid data. An example of a gap between the valid data comprises fragments 970, 972, 974, and 976 (which store invalid data). As depicted in FIG. 9, fragments 970, 972, 974, and 976 are between fragment 962$s$ (which stores valid data) and fragment 964$s$ (which stores valid data). The compaction process will remove this gap.

The compaction process will comprise the control die 204 reading the fragments of source block 950, compacting the data and storing the compacted data in destination block 952 (without transferring the data to memory controller 120). FIG. 9 shows the data in destination block 952 such that there are no gaps in the valid data. Therefore, the data is stored more efficiently and there is more open space in destination block 952 to store additional data. FIG. 9 shows fragments 960$d$, 962$d$, 964$d$, and 966$d$ in the destination block 952, which correspond to valid fragments 960$s$, 962$s$, 964$s$, and 966$s$ respectively in the source block 950.

Figure 10:
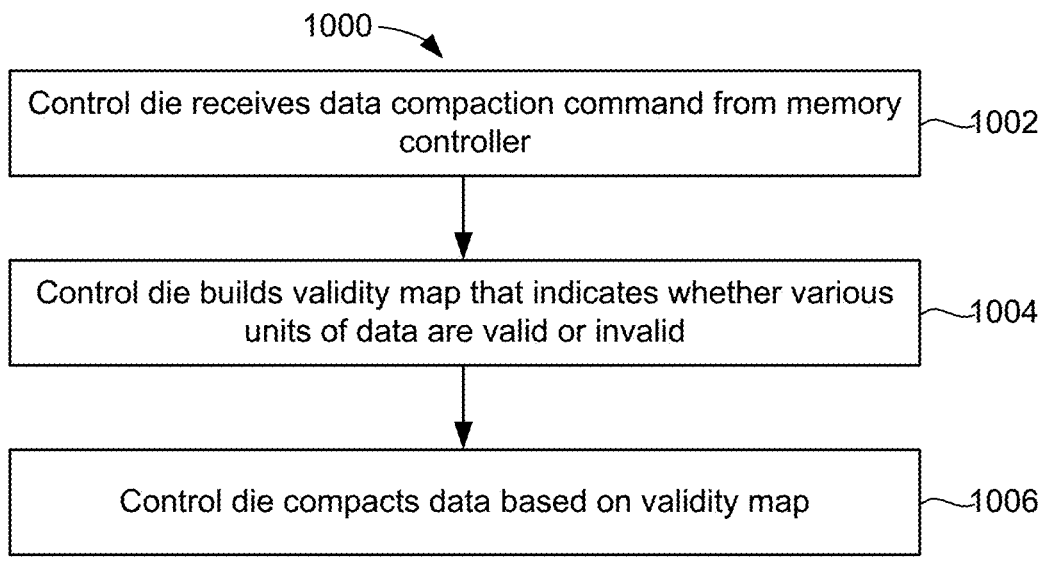
FIG. 10 is a flowchart of one embodiment of a process of auto-compaction of data in an integrated memory assembly.

FIG. 10 is a flowchart of one embodiment of a process 1000 of auto-compaction of data in an integrated memory assembly 104. The process 1000 is performed by control circuitry 210 on the control die 204. The process 1000 may be performed by hardware and/or software that programs one or more processors (e.g., microprocessor, microcontroller, RISC processor, etc.) on control die 204.

Step 1002 includes the control die 204 receiving a data compaction command from the memory controller 120. The data compaction command may be received via MC interface 232. In one embodiment, the command specifies one or more source blocks and one or more destination blocks. The one or more source blocks are those that are candidates for compaction. The one or more destination blocks are available to store the compacted data. The blocks may be identified by physical block addresses in the memory die 202.

Step 1004 includes the control die 204 building a validity map 730 that indicates whether various units of data are valid or invalid. In one embodiment, each unit of data is a fragment. In one embodiment, each unit of data is a page. In one embodiment, the control die 204 uses information in the L2P table 710 to build validity map 730. The control die 204 may also examine logical addresses in the headers of the units of data. Further details are discussed below.

Step 1006 includes the control die 204 compacting the data based on the validity map 730. For example, with respect to FIG. 9, the control die 204 reads in the valid fragments from the source block 950 and programs those valid fragments to the destination block 952. In one embodiment, the valid fragments are temporarily stored in storage region 218 prior to writing them to the destination block. Optionally, the control die 204 may update the L2P table 710, which it stores to the memory die 202. Further details of one embodiment of data compaction are discussed below in connection with FIG. 13.

Figure 11:
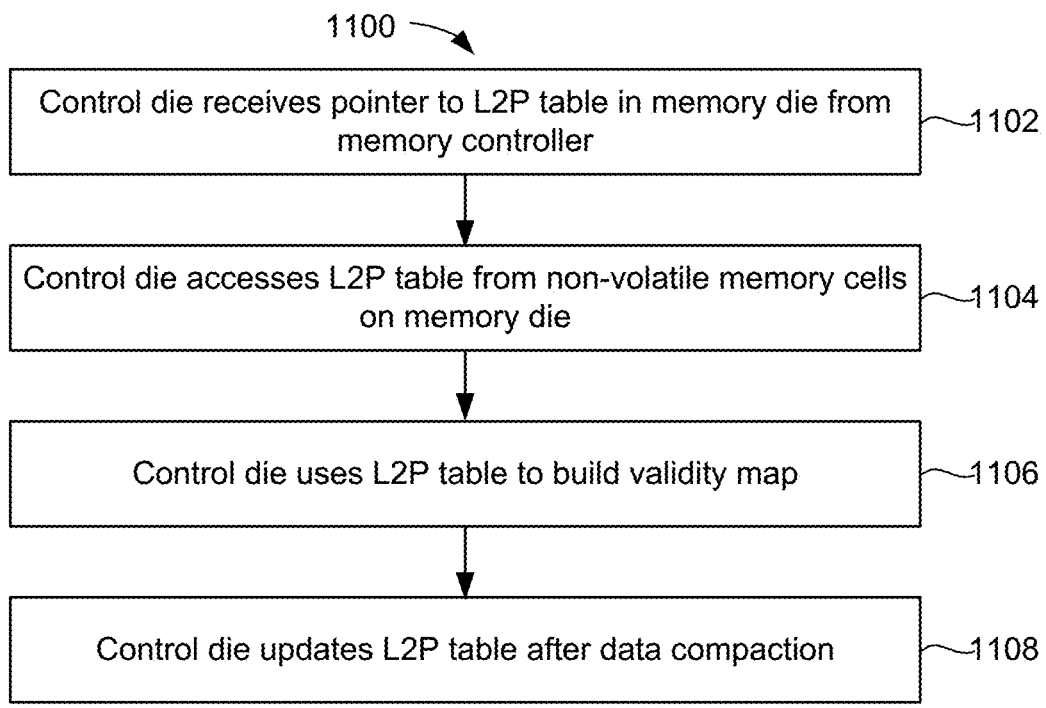
FIG. 11 is a flowchart of one embodiment of a process of updating an L2P table as a result of auto-relocation of data in an integrated memory assembly.

FIG. 11 is a flowchart of one embodiment of a process 1100 of updating an L2P table as a result of auto-relocation of data in an integrated memory assembly 104. The process 1100 is performed by control circuitry 210 on the control die 204.

Step 1102 includes the control die 204 receiving a pointer to the L2P table 710 from the memory controller 120. The pointer specifies a physical location on the memory die 202 at which the L2P table 710 is stored. The pointer may be received via MC interface 232.

Step 1104 includes the control die 204 accessing the L2P table 710 from non-volatile memory cells on the memory die 202. In an embodiment, the control die 204 is bonded to the memory die 202 by way of a large number of bond pads. The memory die 202 has bit lines and a first set of pathways. Each of the bit lines may be connected to a pathway of the first set of pathways. The control die 204 has sense amplifiers 260 and a second set of pathways connected to the first set of pathways by way of the bond pads. Each of the sense amplifiers 260 is connected to a pathway of the second set of pathways. Therefore, the control die 204 is able to sense the memory cells by way of the first set of pathways and the second set of pathways. Thus, the control die 204 is able to access the L2P table 710 by signals that pass through the bond pads. Significantly, the control die 204 can sense all of the bit lines in parallel, which provides for a much faster data transfer than if the L2P table 710 were transferred from the control die 204 to the memory controller 120 over, for example, an ONFI bus.

Step 1106 includes the control die 204 using the L2P table 710 to build a validity map 730. Further details of one embodiment of building the validity map 730 are discussed below in connection with FIG. 12.

Step 1108 includes the control die 204 updating the L2P table 710 after data compaction.

Figure 12:
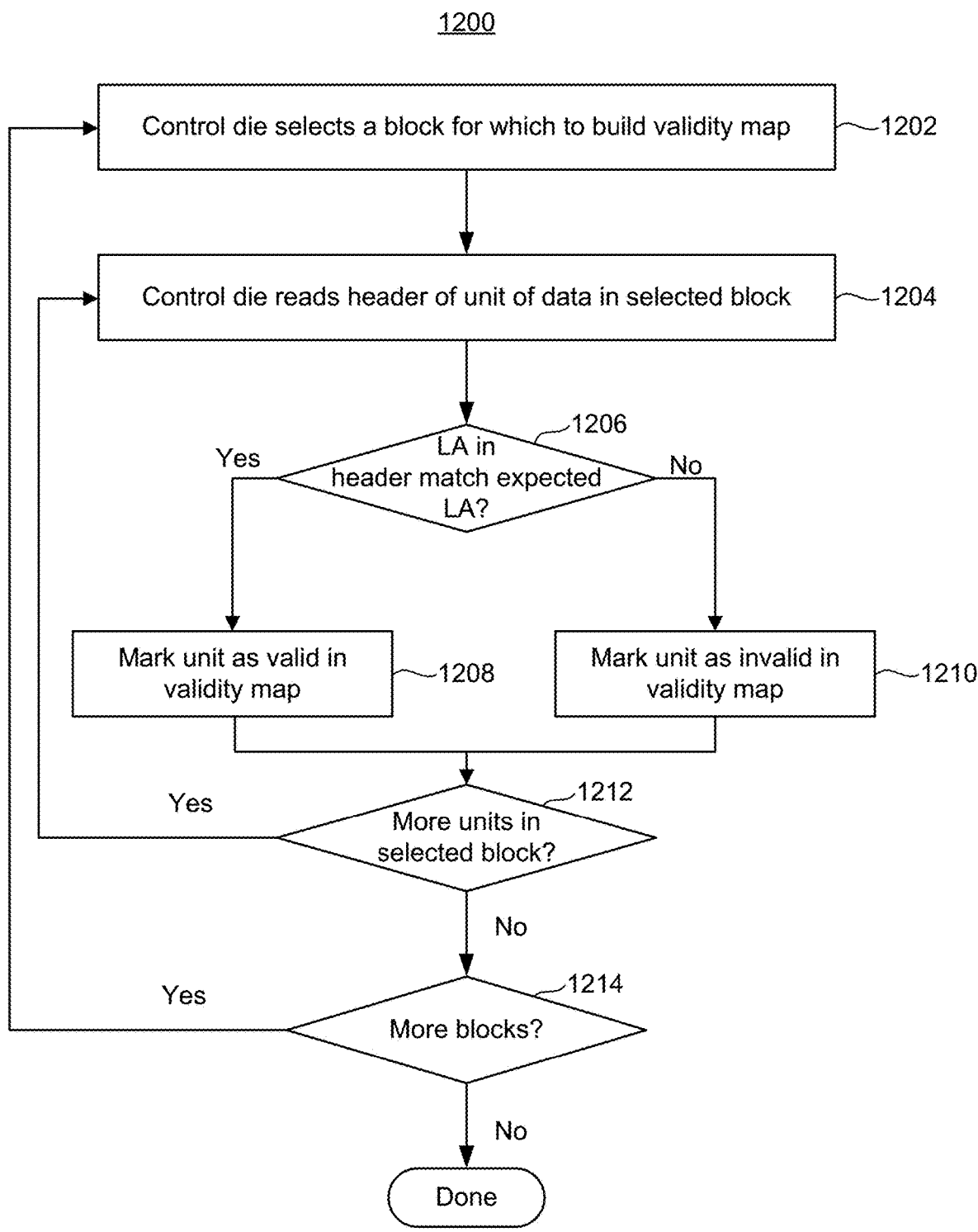
FIG. 12 is a flowchart of one embodiment of a process of a control die building a validity map.

FIG. 12 is a flowchart of one embodiment of a process 1200 of the control die 204 building a validity map. Process 1200 may be used in step 1004 of process 1000 or step 1106 of process 1100.

Step 1202 includes the control die 204 selecting a block for which to build a validity map 730. Optionally, the memory controller 120 may provide the address of the block for which to build the validity map 730.

Step 1204 includes the control die 204 reading a header of a unit of data in the selected block. In one embodiment, the unit of data is a fragment. In one embodiment, the unit of data is an ECC codeword. In one embodiment, the unit of data is a page. The header includes metadata for the unit of data. The metadata includes a logical address for the unit of data. The control die 204 may read the header and the unit of data together. However, reading the unit of data is not a requirement. In some cases, the control die 204 can read multiple headers in parallel. For example, multiple headers could be stored in memory cells connected to the same word line. The control die 204 may sense all of the memory cells connected to the word line in parallel (see FIG. 4A).

The control die 204 may read the header(s) in a similar way as described for reading the L2P table in step 1104 of process 1100. Thus, the header(s) may be read by way of the bond pads as described above for reading the L2P table 710. Significantly, the control die 204 can sense all of the bit lines in parallel, which provides for a much faster data transfer than if the header(s) were transferred from the control die 204 to the memory controller 120 over, for example, an ONFI bus.

Step 1206 includes the control circuitry 210 determining whether the logical address (LA) in the header matches an expected logical address. In an embodiment, the control circuitry 210 examines the L2P table 710 to determine what logical address should be associated with a physical address. If the logical address in the header matches the expected logical address, then the data at the physical address is valid. If the logical address in the header does not match the expected logical address, then the data at the physical address is invalid. Note that in the latter case the data may be stale.

After step 1206, the control circuitry 210 either marks the unit of data as valid in the validity map (step 1208) or marks the unit of data as invalid in the validity map (step 1210). In one embodiment, the control circuitry 210 set a flag in the validity map 730 to mark whether the data for a physical address (corresponding to the physical location of a unit of data) is valid or invalid.

Step 1212 includes a determination of whether there are more units of data in the selected block. If so, the next unit of data is read. As noted above, it is possible to read multiple units of data in parallel. For example, a page may have multiple fragments (with each fragment being a unit of data). Therefore, if multiple units of data are read in parallel in step 1204, then step 1206 is performed for each of the units of data prior to reading the next set of headers. Eventually all of the units in the block are processed, and step 1214 is performed. Step 1214 is a determination of whether another block should be processed. If so, then the control die 204 selects another block to process, followed by steps 1204-1212. After all blocks have been processed, the process concludes.

Figure 13:
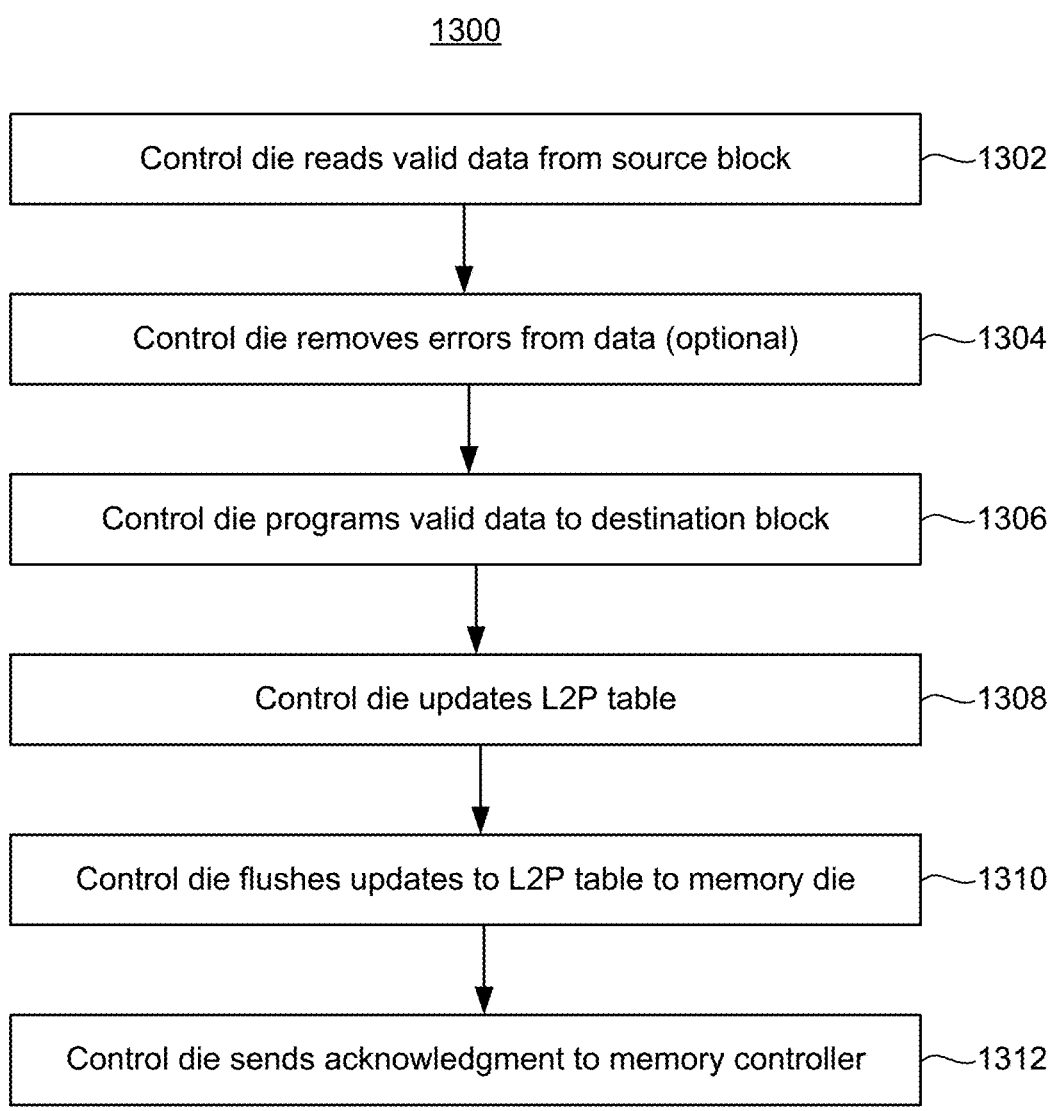
FIG. 13 is a flowchart of one embodiment of a process of a control die compacting data and updating an L2P table.

FIG. 13 is a flowchart of one embodiment of a process 1300 of a control die 204 compacting data and updating an L2P table. Steps 1302-1306 may be used in an embodiment of step 1006 of process 1000. Steps 1308-1312 may be used in an embodiment of step 1108 of process 1100.

Step 1302 includes the control die 204 reading valid data from the source block. The valid fragments are determined based on the validity map 730. For example, with respect to FIG. 9, the control die 204 reads the valid fragments in the source block 950. The valid data may be read by reading the memory cells on one word line. In this case, both valid and invalid fragments could be read, with the invalid fragments discarded. The valid fragments may be temporarily stored in the storage region 218.

Step 1304 includes the control die 204 removing errors from the valid data. Step 1204 is optional. In one embodiment, each unit of data comprises at least one ECC codeword. For example, a fragment may comprise one ECC codeword. The ECC codeword is decoded and error corrected by the ECC engine 230. Therefore, errors are removed from the valid data. The ECC engine 230 then generates a new ECC codeword for the unit of data, which is error free.

Step 1306 includes the control die 204 programming the valid data to the destination block. For example, with respect to FIG. 9, the valid data (possibly error corrected) is programmed to the destination block 952. In one embodiment, the data in the source block is SLC data and the data is programmed as SLC data to the destination block. In one embodiment, the data in the source block is MLC data and the data is programmed as MLC data to the destination block. In one embodiment, the data in the source block is MLC data, but the data is programmed as SLC data in the destination block.

Step 1308 includes the control die 204 updating the L2P table 710. For example, with reference to FIG. 9, the L2P table 710 has a logical address for each of the valid fragments in the source block 950. Originally, the L2P table 710 will map the logical address each respective valid fragment to the physical address in the source block 950. After the data compaction, the L2P table 710 is updated to map the logical address of each respective valid fragment to the physical address in the destination block 952.

Step 1310 includes the control die 204 flushing the updates to the L2P table 710 to the memory die 202. Step 1310 includes programming the memory cells on the memory die to flush the updates to the L2P table 710 to the memory die 202.

Step 1312 includes the control die 204 sending an acknowledgment message to the memory controller 120. This acknowledgment indicates that the data has been compacted. The acknowledgment also indicates that the L2P table 710 has been updated. The acknowledgment may also include a pointer to indicate a physical location of the updated portion of the L2P table.

Figure 14:
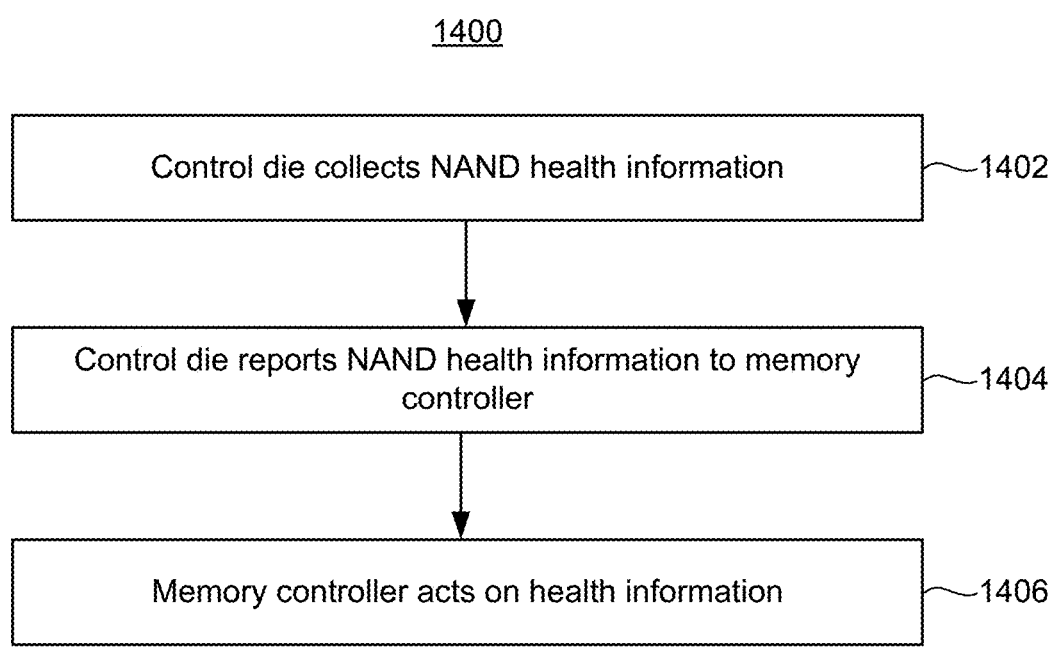
FIG. 14 is a flowchart of one embodiment of a process of a control die collecting and reporting data statistics.

In some embodiments, the control die 204 collects statistics about the data stored in the memory die 202. This will include statistics that the memory controller 120 would otherwise not be aware of. For example, decoding data with the ECC engine 230 on the control die 204 may reveal bit error rates. The control die 204 reports these statistics to the memory controller 120. FIG. 14 is a flowchart of one embodiment of a process 1400 of the control die collecting and reporting data statistics. Step 1402 includes the control die collecting NAND health information. This information may include error counts that are determined by the ECC engine 230. Step 1404 includes the control die reporting the NAND health information to the memory controller 120. Step 1406 includes the memory controller performing memory management of the memory die 202 based on the NAND health information. For example, the memory controller 120 might perform wear leveling or read refresh in response to the statistics.

An integrated memory assembly is disclosed that comprises a memory die and a control die bonded to the memory die. The memory die includes a memory structure of non-volatile memory cells. The control die is configured to program user data to and read user data from the memory die in response to commands from a memory controller. In an embodiment, to utilize space more efficiently on the memory die, the control die compacts fragmented data on the memory die. In an embodiment, to reduce data transfers between the control die and a memory controller, the control die updates an L2P table that is stored on the memory die. In an embodiment, to reduce data transfers between the control die and a memory controller, the control die generates a validity map that is used to compact the data.

A first embodiment includes an apparatus comprising a first semiconductor die comprising non-volatile memory cells and a first plurality of pathways. The apparatus comprises a second semiconductor die comprising one or more control circuits and a second plurality of pathways. The second semiconductor die is bonded to the first semiconductor die such that each pathway of the first plurality of pathways is bonded to a respective pathway of the second plurality of pathways. The second semiconductor die further comprises an interface to an off die circuit. The one or more control circuits are configured to sense the memory cells in parallel by way of pairs of the first plurality of pathways and the second plurality of pathways. The one or more control circuits are configured to receive a relocation trigger from the off die circuit via the interface. The one or more control circuits are configured to relocate data from a first set of physical addresses in the first semiconductor die to a second set of physical addresses in the first semiconductor die in response to the relocation trigger. The one or more control circuits are configured to update a logical address to physical address translation table in the non-volatile memory cells in the first semiconductor die to associate the second set of physical addresses with logical addresses of data moved to the second set of physical addresses.

In a second embodiment, in furtherance to the first embodiment, the one or more control circuits are further configured to send a message to the off die circuit that the logical address to physical address translation table has been updated following the data relocation.

In a third embodiment, in furtherance to the first or second embodiments, the one or more control circuits are further configured to build a validity map that indicates whether respective units of data stored in the non-volatile memory cells on the first semiconductor die are valid or invalid based on associations between logical addresses and physical addresses in the logical address to physical address translation table.

In a fourth embodiment, in furtherance to the third embodiment, the one or more control circuits are further configured to compact data in the non-volatile memory cells on the first semiconductor die based on the validity map. The compacting includes moving data from the first set of physical addresses in the first semiconductor die to the second set of physical addresses in the first semiconductor die to remove one or more gaps in the valid data at the first set of physical addresses.

In a fifth embodiment, in furtherance to the third or fourth embodiments, the one or more control circuits are further configured to read, by way of the first plurality of pathways and the second plurality of pathways, metadata in headers of units of data stored in non-volatile memory cells of the first semiconductor die. The one or more control circuits are further configured to determine whether the respective units of data are valid based on the metadata in the headers to build the validity map.

In a sixth embodiment, in furtherance to any of the third to fifth embodiments, the one or more control circuits are further configured to compare a logical address in metadata in a header of a unit of data with an expected logical address for the unit of data; determine that the unit of data is valid if the logical address in the metadata in the header of the unit of data matches the expected logical address for the unit of data; and determine that the unit of data is invalid if the logical address in the metadata in the header of the unit of data does not match the expected logical address for the unit of data.

In a seventh embodiment, in furtherance to any of the first to sixth embodiments, the units of data are flash management units.

In an eighth embodiment, in furtherance to any of the first to seventh embodiments, the one or more control circuits are further configured to collect statistics regarding data stored in the non-volatile memory cells. The one or more control circuits are further configured to report the statistics to the off die circuit.

In a ninth embodiment, in furtherance to any of the first to eighth embodiments, the off die circuit comprises a memory controller.

In a tenth embodiment, in furtherance to any of the first to ninth embodiments, the first semiconductor die further comprises a plurality of bit lines connected to respective ones of the first plurality of pathways. The second semiconductor die further comprises a plurality of sense amplifiers, with each sense amplifier connected to a pathway of the second plurality of pathways. The sense amplifiers are configured to sense the bit lines in parallel to read a page of the logical address to physical address translation table.

In an eleventh embodiment, in furtherance to any of the first to tenth embodiments, the first semiconductor die further comprises a plurality of bit lines connected to respective ones of the first plurality of pathways. The second semiconductor die further comprises a plurality of sense amplifiers, with each sense amplifier connected to a pathway of the second plurality of pathways. The sense amplifiers are configured to apply voltages to the bit lines in parallel when programming a page of the logical address to physical address translation table to the first memory die to update the table.

An embodiment includes a method of compacting data in non-volatile storage. The method comprising: reading, by a control circuit on a first semiconductor die bonded to second semiconductor die, a logical address to physical address translation table stored in non-volatile memory cells on the second semiconductor die, including sensing a page of the memory cells in parallel; compacting units of data, by the control circuit on the first semiconductor die, based on the logical address to physical address translation table to remove one or more gaps in valid data; updating, by the control circuit on the first semiconductor die, the logical address to physical address translation table after compacting the units of data; and storing, by the control circuit on the first semiconductor die, the updated logical address to physical address translation table in the non-volatile memory cells on the second semiconductor die, including transferring a page of the physical address translation table to the second semiconductor die in parallel.

An embodiment includes a non-volatile storage system comprising a memory controller and an integrated memory assembly separate from and in communication with the memory controller. The integrated memory assembly comprises a memory die that includes a three dimensional memory structure of non-volatile memory cells and a control die bonded by bond pads to the memory die. The control die has a communication interface configured to receive a data compaction command from the memory controller. The control die is configured to control magnitude and timing of voltages applied to the three dimensional memory structure during memory operations. The control die comprises validity maps means for building a validity map that indicates whether respective fragments of data stored in the non-volatile memory cells of the memory die are valid or invalid. The control die comprises data compaction means for programming, by way of the bond pads, compacted data to non-volatile memory cells of the memory die based on the validity map. The data compacting includes moving data fragments from a first set of physical addresses in the memory die to a second set of physical addresses in the memory die to remove one or more gaps between the data fragments at the first set of physical addresses.

In one embodiment, the validity maps means for building a validity map that indicates whether respective fragments of data stored in the non-volatile memory cells of the memory die are valid or invalid comprises one or more of state machine 212, address decoders 214, power control 216, and/or read/write circuits 228. The validity maps means may be implemented by a processor, PGA (Programmable Gate Array, FPGA (Field Programmable Gate Array), ASIC (Application Specific Integrated Circuit), microcontroller, integrated circuit or other type of circuit. In an embodiment, the validity maps means performs process 1200 in FIG. 12.

In one embodiment, the data compaction means for programming compacted data to non-volatile memory cells of the memory die based on the validity map comprises one or more of state machine 212, address decoders 214, power control 216, and/or read/write circuits 228. The data compaction means may be implemented by a processor, PGA (Programmable Gate Array, FPGA (Field Programmable Gate Array), ASIC (Application Specific Integrated Circuit), microcontroller, integrated circuit or other type of circuit. In an embodiment, the data compaction means performs process 1300 in FIG. 13.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., by way of one or more other parts). In some cases, when an element is referred to as being connected or coupled to another element, the element may be directly connected to the other element or indirectly connected to the other element by way of intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

For purposed of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the disclosed technology and its practical application, to thereby enable others skilled in the art to best utilize it in various embodiments and with various modifications as are suited to the particular use contemplated. It is intended that the scope be defined by the claims appended hereto.

We claim:

1. An apparatus, comprising:
   a first semiconductor die comprising non-volatile memory cells and a first plurality of pathways; and
   a second semiconductor die comprising one or more control circuits and a second plurality of pathways, the second semiconductor die bonded to the first semiconductor die such that each pathway of the first plurality of pathways is bonded to a respective pathway of the second plurality of pathways, the second semiconductor die further comprises an interface to a memory controller, the one or more control circuits are configured to:
receive a relocation trigger and a pointer to a logical address to physical address translation table from the memory controller via the interface;
relocate data from a first set of physical addresses in the first semiconductor die to a second set of physical addresses in the first semiconductor die in response to the relocation trigger, including:
read data from the first set of physical addresses in the first semiconductor die in parallel by way of pairs of the first plurality of pathways and the second plurality of pathways; and
write data to the second set of physical addresses in the first semiconductor die in parallel by way of pairs of the first plurality of pathways and the second plurality of pathways;
update a logical address to physical address translation table in the non-volatile memory cells in the first semiconductor die to associate the second set of physical addresses with logical addresses of data moved to the second set of physical addresses; and
send a message to the memory controller that the logical address to physical address translation table has been updated following the data relocation.

2. The apparatus of claim 1, wherein the one or more control circuits are further configured to:
build a validity map that indicates whether respective units of data stored in the non-volatile memory cells on the first semiconductor die are valid or invalid based on associations between logical addresses and physical addresses in the logical address to physical address translation table.

3. The apparatus of claim 2, wherein the one or more control circuits are further configured to:
compact data in the non-volatile memory cells on the first semiconductor die based on the validity map, the compacting including moving data from the first set of physical addresses in the first semiconductor die to the second set of physical addresses in the first semiconductor die to remove one or more gaps in the valid data at the first set of physical addresses.

4. The apparatus of claim 2, wherein the one or more control circuits are further configured to:
read, by way of the first plurality of pathways and the second plurality of pathways, metadata in headers of units of data stored in non-volatile memory cells of the first semiconductor die; and
determine whether the respective units of data are valid based on the metadata in the headers to build the validity map.

5. The apparatus of claim 2, wherein the one or more control circuits are further configured to:
compare a logical address in metadata in a header of a unit of data with an expected logical address for the unit of data;
determine that the unit of data is valid if the logical address in the metadata in the header of the unit of data matches the expected logical address for the unit of data; and
determine that the unit of data is invalid if the logical address in the metadata in the header of the unit of data does not match the expected logical address for the unit of data.

6. The apparatus of claim 2, wherein the units of data are flash management units.

7. The apparatus of claim 1, wherein the one or more control circuits are further configured to:
collect statistics regarding data stored in the non-volatile memory cells; and
report the statistics to the memory controller.

8. The apparatus of claim 1, wherein:
the first semiconductor die further comprises a plurality of bit lines, each bit line connected to a pathway of the first plurality of pathways; and
the second semiconductor die further comprises a plurality of sense amplifiers, each sense amplifier connected to a pathway of the second plurality of pathways, wherein the sense amplifiers are configured to sense the bit lines in parallel to read a page of the logical address to physical address translation table.

9. The apparatus of claim 1, wherein:
the first semiconductor die further comprises a plurality of bit lines, each bit line connected to a pathway of the first plurality of pathways; and
the second semiconductor die further comprises a plurality of sense amplifiers, each sense amplifier connected to a pathway of the second plurality of pathways, wherein the sense amplifiers are configured to apply voltages to the bit lines in parallel when programming a page of the logical address to physical address translation table to the first semiconductor die to update the table.

10. A method for managing non-volatile storage, the method comprising:
receiving, by a control circuit on a first semiconductor die bonded to a second semiconductor die to the first semiconductor die such that each pathway of a first plurality of pathways on the first semiconductor die is bonded to a respective pathway of a second plurality of pathways on the second semiconductor die, a relocation trigger and a pointer to a logical address to physical address translation table from a memory controller;
relocating data from non-volatile memory cells at a first set of physical addresses in the second semiconductor die to non-volatile memory cells at a second set of physical addresses in the second semiconductor die in response to the relocation trigger, including:
reading data from the non-volatile memory cells at the first set of physical addresses in the second semiconductor die in parallel by way of pairs of the first plurality of pathways in the first semiconductor die and the second plurality of pathways in the second semiconductor die; and
writing data to the non-volatile memory cells at the second set of physical addresses in the second semiconductor die in parallel by way of pairs of the first plurality of pathways and the second plurality of pathways;
updating a logical address to physical address translation table in the non-volatile memory cells in the second semiconductor die to associate the second set of physical addresses with logical addresses of data moved to the second set of physical addresses; and
sending a message from the first semiconductor die to the memory controller that the logical address to physical address translation table has been updated following the data relocation.

11. The method of claim 10, further comprising:
building a validity map on the first semiconductor die that indicates whether respective units of data stored in the non-volatile memory cells on the second semiconductor die are valid or invalid based on associations between logical addresses and physical addresses in the logical address to physical address translation table.

12. The method of claim 11, further comprising:
compacting data in the non-volatile memory cells on the second semiconductor die based on the validity map, the compacting including moving data from the first set of physical addresses in the first semiconductor die to the second set of physical addresses in the first semiconductor die to remove one or more gaps in the valid data at the first set of physical addresses.

13. The method of claim 11, further comprising:
reading, by way of the first plurality of pathways and the second plurality of pathways, metadata in headers of units of data stored in non-volatile memory cells of the second semiconductor die; and
determining whether the respective units of data are valid based on the metadata in the headers to build the validity map.

14. The method of claim 11, further comprising:
comparing a logical address in metadata in a header of a unit of data with an expected logical address for the unit of data;
determining that the unit of data is valid if the logical address in the metadata in the header of the unit of data matches the expected logical address for the unit of data; and
determining that the unit of data is invalid if the logical address in the metadata in the header of the unit of data does not match the expected logical address for the unit of data.

15. The method of claim 10, further comprising:
collecting statistics regarding data stored in the non-volatile memory cells; and
reporting the statistics to the memory controller.

16. A non-volatile storage system comprising:
a memory controller; and
an integrated memory assembly separate from and in communication with the memory controller, the integrated memory assembly comprising a memory die that includes a three dimensional memory structure of non-volatile memory cells and a control die bonded by bond pads to the memory die, the control die configured to control magnitude and timing of voltages applied to the three dimensional memory structure during memory operations, the control die comprising:
interface means for receiving a relocation trigger from the memory controller;
data relocate data means for relocating data from a first set of physical addresses in the memory die to a second set of physical addresses in the memory die in response to the relocation trigger, including:
reading at least one ECC codeword of data from the first set of physical addresses in the memory die in parallel by way of pairs of a first plurality of pathways of the control die and a second plurality of pathways of the memory die;
error correcting the at least one ECC codeword of data read from the first set of physical addresses; and
writing the error corrected at least one ECC codeword of data to the second set of physical addresses in the memory die in parallel by way of pairs of the first plurality of pathways and the second plurality of path; and
update means for updating a logical address to physical address translation table in the non-volatile memory cells in the memory die to associate the second set of physical addresses with logical addresses of data moved to the second set of physical addresses.

17. The non-volatile storage system of claim 16, wherein the interface means is further for receiving a pointer to the logical address to physical address translation table from the memory controller.

* * * * *